US011218165B2

(12) United States Patent
Chen et al.

(10) Patent No.: US 11,218,165 B2
(45) Date of Patent: Jan. 4, 2022

(54) MEMORY-MAPPED TWO-DIMENSIONAL ERROR CORRECTION CODE FOR MULTI-BIT ERROR TOLERANCE IN DRAM

(71) Applicant: Alibaba Group Holding Limited, George Town (KY)

(72) Inventors: Jian Chen, San Jose, CA (US); Ying Zhang, San Jose, CA (US)

(73) Assignee: Alibaba Group Holding Limited, George Town (KY)

( * ) Notice: Subject to any disclaimer, the term of this patent is extended or adjusted under 35 U.S.C. 154(b) by 0 days.

(21) Appl. No.: 16/875,827

(22) Filed: May 15, 2020

(65) Prior Publication Data

US 2021/0359704 A1 Nov. 18, 2021

(51) Int. Cl.
*H03M 13/00* (2006.01)
*H03M 13/09* (2006.01)
(Continued)

(52) U.S. Cl.
CPC ....... *H03M 13/095* (2013.01); *G06F 11/1004* (2013.01); *G06F 11/1068* (2013.01); *G11C 29/42* (2013.01); *G11C 29/52* (2013.01)

(58) Field of Classification Search
CPC .... G06F 3/0619; G06F 3/0688; G06F 11/108; G06F 11/1004; G06F 11/1068;
(Continued)

(56) References Cited

U.S. PATENT DOCUMENTS 3,893,071 A   7/1975   Bossen
4,562,494 A   12/1985  Bond
(Continued)

FOREIGN PATENT DOCUMENTS

JP   2003022209   1/2003
JP   2011175422   9/2011
(Continued)

OTHER PUBLICATIONS https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).

(Continued)

*Primary Examiner* — Albert Decady
*Assistant Examiner* — Enamul M Kabir
(74) *Attorney, Agent, or Firm* — Shun Yao; Park, Vaughan, Fleming & Dowler LLP

(57) ABSTRACT

One embodiment provides a system and method for facilitating error-correction protection in a storage device. In response to a write request, the system organizes a block of data in a two-dimensional (2D) array, forms a plurality of first-dimension sub-blocks by dividing the 2D array along a first dimension, and forms a plurality of second-dimension sub-blocks by dividing the 2D array along a second dimension. In response to determining that second-dimension error correction code (ECC) encoding is enabled, the system performs second-dimension ECC encoding on the second-dimension sub-blocks to generate a set of second-dimension ECC bits and performs first-dimension ECC encoding on the first-dimension sub-blocks and the second-dimension ECC bits to generate a set of first-dimension ECC bits. The system writes the data block along with the second-dimension ECC bits and the first-dimension ECC bits to the storage device. The data block and the second-dimension ECC bits are mapped to separate physical addresses in the storage device.

20 Claims, 11 Drawing Sheets

(51) Int. Cl.
  *G11C 29/52* (2006.01)
  *G11C 29/42* (2006.01)
  *G06F 11/10* (2006.01)

(58) Field of Classification Search
  CPC ..... G06F 11/1072; G11C 29/42; G11C 29/52; H03M 13/095; H03M 13/098; H03M 13/2915
  See application file for complete search history.

(56) References Cited

U.S. PATENT DOCUMENTS

| | | | | |
|---|---|---|---|---|
| 4,718,067 | A | 1/1988 | Peters | |
| 4,775,932 | A | 10/1988 | Oxley | |
| 4,858,040 | A | 8/1989 | Hazebrouck | |
| 5,394,382 | A | 2/1995 | Hu | |
| 5,602,693 | A | 2/1997 | Brunnett | |
| 5,732,093 | A | 3/1998 | Huang | |
| 5,802,551 | A | 9/1998 | Komatsu | |
| 5,930,167 | A | 7/1999 | Lee | |
| 6,098,185 | A | 8/2000 | Wilson | |
| 6,148,377 | A | 11/2000 | Carter | |
| 6,226,650 | B1 | 5/2001 | Mahajan et al. | |
| 6,243,795 | B1 | 6/2001 | Yang | |
| 6,457,104 | B1 | 9/2002 | Tremaine | |
| 6,581,178 | B1* | 6/2003 | Kondo | H03M 13/09 714/758 |
| 6,658,478 | B1 | 12/2003 | Singhal | |
| 6,795,894 | B1 | 9/2004 | Neufeld | |
| 7,351,072 | B2 | 4/2008 | Muff | |
| 7,539,926 | B1* | 5/2009 | Lesea | G06F 11/1004 714/758 |
| 7,565,454 | B2 | 7/2009 | Zuberi | |
| 7,599,139 | B1 | 10/2009 | Bombet | |
| 7,953,899 | B1 | 5/2011 | Hooper | |
| 7,958,433 | B1 | 6/2011 | Yoon | |
| 8,085,569 | B2 | 12/2011 | Kim | |
| 8,117,519 | B2* | 2/2012 | Ito | G06F 11/106 714/764 |
| 8,122,317 | B1* | 2/2012 | Clark | H03M 13/2909 714/758 |
| 8,144,512 | B2 | 3/2012 | Huang | |
| 8,166,233 | B2 | 4/2012 | Schibilla | |
| 8,260,924 | B2 | 9/2012 | Koretz | |
| 8,281,061 | B2 | 10/2012 | Radke | |
| 8,452,819 | B1 | 5/2013 | Sorenson, III | |
| 8,516,284 | B2 | 8/2013 | Chan | |
| 8,527,544 | B1 | 9/2013 | Colgrove | |
| 8,751,763 | B1 | 6/2014 | Ramarao | |
| 8,825,937 | B2 | 9/2014 | Atkisson | |
| 8,868,825 | B1 | 10/2014 | Hayes | |
| 8,904,061 | B1 | 12/2014 | O'Brien, III | |
| 8,924,776 | B1* | 12/2014 | Mollov | G06F 3/0647 714/6.24 |
| 8,949,208 | B1 | 2/2015 | Xu | |
| 9,015,561 | B1 | 4/2015 | Hu | |
| 9,043,545 | B2 | 5/2015 | Kimmel | |
| 9,088,300 | B1 | 7/2015 | Chen | |
| 9,092,223 | B1 | 7/2015 | Pani | |
| 9,129,628 | B1 | 9/2015 | Fallone | |
| 9,141,176 | B1 | 9/2015 | Chen | |
| 9,208,817 | B1 | 12/2015 | Li | |
| 9,280,472 | B1 | 3/2016 | Dang | |
| 9,280,487 | B2 | 3/2016 | Candelaria | |
| 9,311,939 | B1 | 4/2016 | Malina | |
| 9,336,340 | B1 | 5/2016 | Dong | |
| 9,436,595 | B1 | 9/2016 | Benitez | |
| 9,529,601 | B1 | 12/2016 | Dharmadhikari | |
| 9,588,698 | B1 | 3/2017 | Karamcheti | |
| 9,588,977 | B1 | 3/2017 | Wang | |
| 9,607,631 | B2 | 3/2017 | Rausch | |
| 9,747,202 | B1 | 8/2017 | Shaharabany | |
| 9,852,076 | B1 | 12/2017 | Garg | |
| 9,875,053 | B2 | 1/2018 | Frid | |
| 9,946,596 | B2 | 4/2018 | Hashimoto | |
| 10,013,169 | B2 | 7/2018 | Fisher | |
| 10,199,066 | B1 | 2/2019 | Feldman | |
| 10,229,735 | B1 | 3/2019 | Natarajan | |
| 10,235,198 | B2 | 3/2019 | Qiu | |
| 10,318,467 | B2 | 6/2019 | Barzik | |
| 10,361,722 | B2 | 7/2019 | Lee | |
| 10,437,670 | B1 | 10/2019 | Koltsidas | |
| 10,642,522 | B2 | 5/2020 | Li | |
| 10,649,657 | B2 | 5/2020 | Zaidman | |
| 2001/0032324 | A1 | 10/2001 | Slaughter | |
| 2001/0050622 | A1* | 12/2001 | Hewitt | H03M 13/2903 341/50 |
| 2002/0010783 | A1 | 1/2002 | Primak | |
| 2002/0039260 | A1 | 4/2002 | Kilmer | |
| 2002/0073358 | A1 | 6/2002 | Atkinson | |
| 2002/0095403 | A1 | 7/2002 | Chandrasekaran | |
| 2002/0161890 | A1 | 10/2002 | Chen | |
| 2003/0074319 | A1 | 4/2003 | Jaquette | |
| 2003/0145274 | A1 | 7/2003 | Hwang | |
| 2003/0163594 | A1 | 8/2003 | Aasheim | |
| 2003/0163633 | A1 | 8/2003 | Aasheim | |
| 2003/0217080 | A1 | 11/2003 | White | |
| 2004/0010545 | A1 | 1/2004 | Pandya | |
| 2004/0066741 | A1 | 4/2004 | Dinker | |
| 2004/0103238 | A1 | 5/2004 | Avraham | |
| 2004/0143718 | A1 | 7/2004 | Chen | |
| 2004/0255171 | A1 | 12/2004 | Zimmer | |
| 2004/0268278 | A1 | 12/2004 | Hoberman | |
| 2005/0038954 | A1 | 2/2005 | Saliba | |
| 2005/0097126 | A1 | 5/2005 | Cabrera | |
| 2005/0149827 | A1 | 7/2005 | Lambert | |
| 2005/0174670 | A1 | 8/2005 | Dunn | |
| 2005/0177672 | A1 | 8/2005 | Rao | |
| 2005/0177755 | A1 | 8/2005 | Fung | |
| 2005/0195635 | A1 | 9/2005 | Conley | |
| 2005/0235067 | A1 | 10/2005 | Creta | |
| 2005/0235171 | A1 | 10/2005 | Igari | |
| 2006/0031709 | A1 | 2/2006 | Hiraiwa | |
| 2006/0156012 | A1 | 7/2006 | Beeson | |
| 2006/0256615 | A1* | 11/2006 | Larson | G06F 11/106 365/185.09 |
| 2007/0033323 | A1 | 2/2007 | Gorobets | |
| 2007/0061502 | A1 | 3/2007 | Lasser | |
| 2007/0101096 | A1 | 5/2007 | Gorobets | |
| 2007/0283081 | A1 | 12/2007 | Lasser | |
| 2007/0285980 | A1 | 12/2007 | Shimizu | |
| 2008/0034154 | A1 | 2/2008 | Lee | |
| 2008/0065805 | A1 | 3/2008 | Wu | |
| 2008/0082731 | A1 | 4/2008 | Karamcheti | |
| 2008/0112238 | A1 | 5/2008 | Kim | |
| 2008/0301532 | A1 | 12/2008 | Uchikawa | |
| 2009/0006667 | A1 | 1/2009 | Lin | |
| 2009/0089544 | A1 | 4/2009 | Liu | |
| 2009/0113219 | A1 | 4/2009 | Aharonov | |
| 2009/0183052 | A1 | 7/2009 | Kanno | |
| 2009/0282275 | A1 | 11/2009 | Yermalayeu | |
| 2009/0287956 | A1 | 11/2009 | Flynn | |
| 2009/0307249 | A1 | 12/2009 | Koifman | |
| 2009/0310412 | A1 | 12/2009 | Jang | |
| 2010/0031000 | A1 | 2/2010 | Flynn | |
| 2010/0169470 | A1 | 7/2010 | Takashige | |
| 2010/0217952 | A1 | 8/2010 | Iyer | |
| 2010/0229224 | A1 | 9/2010 | Etchegoyen | |
| 2010/0241848 | A1 | 9/2010 | Smith | |
| 2010/0241926 | A1* | 9/2010 | Wang | H04L 1/0064 714/758 |
| 2010/0321999 | A1 | 12/2010 | Yoo | |
| 2010/0325367 | A1 | 12/2010 | Kornegay | |
| 2010/0332922 | A1 | 12/2010 | Chang | |
| 2011/0031546 | A1 | 2/2011 | Uenaka | |
| 2011/0055458 | A1 | 3/2011 | Kuehne | |
| 2011/0055471 | A1 | 3/2011 | Thatcher | |
| 2011/0072204 | A1 | 3/2011 | Chang | |
| 2011/0099418 | A1 | 4/2011 | Chen | |
| 2011/0153903 | A1 | 6/2011 | Hinkle | |
| 2011/0161784 | A1 | 6/2011 | Selinger | |
| 2011/0191525 | A1 | 8/2011 | Hsu | |
| 2011/0218969 | A1 | 9/2011 | Anglin | |
| 2011/0231598 | A1 | 9/2011 | Hatsuda | |

(56) References Cited

U.S. PATENT DOCUMENTS

| | | |
|---|---|---|
| 2011/0239083 A1 | 9/2011 | Kanno |
| 2011/0252188 A1 | 10/2011 | Weingarten |
| 2011/0258514 A1 | 10/2011 | Lasser |
| 2011/0292538 A1 | 12/2011 | Haga |
| 2011/0299317 A1 | 12/2011 | Shaeffer |
| 2011/0302353 A1 | 12/2011 | Confalonieri |
| 2012/0039117 A1 | 2/2012 | Webb |
| 2012/0084523 A1 | 4/2012 | Littlefield |
| 2012/0089774 A1 | 4/2012 | Kelkar |
| 2012/0096330 A1 | 4/2012 | Przybylski |
| 2012/0117399 A1 | 5/2012 | Chan |
| 2012/0147021 A1 | 6/2012 | Cheng |
| 2012/0159099 A1 | 6/2012 | Lindamood |
| 2012/0159289 A1 | 6/2012 | Piccirillo |
| 2012/0173792 A1 | 7/2012 | Lassa |
| 2012/0203958 A1 | 8/2012 | Jones |
| 2012/0204077 A1* | 8/2012 | D'Abreu .............. G06F 11/10 714/755 |
| 2012/0210095 A1 | 8/2012 | Nellans |
| 2012/0233523 A1 | 9/2012 | Krishnamoorthy |
| 2012/0246392 A1 | 9/2012 | Cheon |
| 2012/0278579 A1 | 11/2012 | Goss |
| 2012/0284587 A1 | 11/2012 | Yu |
| 2012/0331207 A1 | 12/2012 | Lassa |
| 2013/0013880 A1 | 1/2013 | Tashiro |
| 2013/0024605 A1 | 1/2013 | Sharon |
| 2013/0054822 A1 | 2/2013 | Mordani |
| 2013/0061029 A1 | 3/2013 | Huff |
| 2013/0073798 A1 | 3/2013 | Kang |
| 2013/0080391 A1 | 3/2013 | Raichstein |
| 2013/0145085 A1 | 6/2013 | Yu |
| 2013/0145089 A1 | 6/2013 | Eleftheriou |
| 2013/0151759 A1 | 6/2013 | Shim |
| 2013/0159251 A1 | 6/2013 | Skrenta |
| 2013/0159723 A1 | 6/2013 | Brandt |
| 2013/0166820 A1 | 6/2013 | Batwara |
| 2013/0173845 A1 | 7/2013 | Aslam |
| 2013/0191601 A1 | 7/2013 | Peterson |
| 2013/0219131 A1 | 8/2013 | Alexandron |
| 2013/0238955 A1 | 9/2013 | D Abreu |
| 2013/0254622 A1 | 9/2013 | Kanno |
| 2013/0318283 A1 | 11/2013 | Small |
| 2013/0318395 A1 | 11/2013 | Kalavade |
| 2013/0326306 A1* | 12/2013 | Cideciyan .......... H03M 13/6325 714/756 |
| 2013/0329492 A1* | 12/2013 | Yang .................... G11C 16/10 365/185.03 |
| 2014/0006688 A1 | 1/2014 | Yu |
| 2014/0019650 A1 | 1/2014 | Li |
| 2014/0025638 A1 | 1/2014 | Hu |
| 2014/0082273 A1 | 3/2014 | Segev |
| 2014/0095827 A1 | 4/2014 | Wei |
| 2014/0108414 A1 | 4/2014 | Stillerman |
| 2014/0181532 A1 | 6/2014 | Camp |
| 2014/0195564 A1 | 7/2014 | Talagala |
| 2014/0233950 A1 | 8/2014 | Luo |
| 2014/0250259 A1 | 9/2014 | Ke |
| 2014/0279927 A1 | 9/2014 | Constantinescu |
| 2014/0304452 A1 | 10/2014 | De La Iglesia |
| 2014/0310574 A1 | 10/2014 | Yu |
| 2014/0359229 A1 | 12/2014 | Cota-Robles |
| 2014/0365707 A1 | 12/2014 | Talagala |
| 2015/0019798 A1 | 1/2015 | Huang |
| 2015/0082317 A1 | 3/2015 | You |
| 2015/0106556 A1 | 4/2015 | Yu |
| 2015/0106559 A1 | 4/2015 | Cho |
| 2015/0121031 A1 | 4/2015 | Feng |
| 2015/0142752 A1 | 5/2015 | Chennamsetty |
| 2015/0169397 A1* | 6/2015 | Blaum ................. H03M 13/29 714/756 |
| 2015/0199234 A1 | 7/2015 | Choi |
| 2015/0227316 A1 | 8/2015 | Warfield |
| 2015/0234845 A1 | 8/2015 | Moore |
| 2015/0269964 A1 | 9/2015 | Fallone |
| 2015/0277937 A1 | 10/2015 | Swanson |
| 2015/0294684 A1 | 10/2015 | Qjang |
| 2015/0301964 A1 | 10/2015 | Brinicombe |
| 2015/0304108 A1 | 10/2015 | Obukhov |
| 2015/0347025 A1 | 12/2015 | Law |
| 2015/0363271 A1 | 12/2015 | Haustein |
| 2015/0363328 A1 | 12/2015 | Candelaria |
| 2015/0372597 A1 | 12/2015 | Luo |
| 2016/0014039 A1 | 1/2016 | Reddy |
| 2016/0026575 A1 | 1/2016 | Samanta |
| 2016/0041760 A1 | 2/2016 | Kuang |
| 2016/0048341 A1 | 2/2016 | Constantinescu |
| 2016/0077749 A1 | 3/2016 | Ravimohan |
| 2016/0077968 A1 | 3/2016 | Sela |
| 2016/0098344 A1 | 4/2016 | Gorobets |
| 2016/0098350 A1 | 4/2016 | Tang |
| 2016/0103631 A1 | 4/2016 | Ke |
| 2016/0110254 A1 | 4/2016 | Cronie |
| 2016/0154601 A1 | 6/2016 | Chen |
| 2016/0155750 A1 | 6/2016 | Yasuda |
| 2016/0162167 A1 | 6/2016 | Lee |
| 2016/0179399 A1 | 6/2016 | Melik-Martirosian |
| 2016/0188223 A1 | 6/2016 | Camp |
| 2016/0188890 A1 | 6/2016 | Naeimi |
| 2016/0196179 A1* | 7/2016 | Zhao ..................... G11C 29/52 714/764 |
| 2016/0203000 A1 | 7/2016 | Parmar |
| 2016/0232103 A1 | 8/2016 | Schmisseur |
| 2016/0234297 A1 | 8/2016 | Ambach |
| 2016/0239074 A1 | 8/2016 | Lee |
| 2016/0239380 A1 | 8/2016 | Wideman |
| 2016/0274636 A1 | 9/2016 | Kim |
| 2016/0306853 A1 | 10/2016 | Sabaa |
| 2016/0321002 A1 | 11/2016 | Jung |
| 2016/0342345 A1 | 11/2016 | Kankani |
| 2016/0343429 A1 | 11/2016 | Nieuwejaar |
| 2016/0350002 A1 | 12/2016 | Vergis |
| 2016/0350385 A1 | 12/2016 | Poder |
| 2016/0364146 A1 | 12/2016 | Kuttner |
| 2017/0010652 A1 | 1/2017 | Huang |
| 2017/0075583 A1 | 3/2017 | Alexander |
| 2017/0075594 A1 | 3/2017 | Badam |
| 2017/0091110 A1 | 3/2017 | Ash |
| 2017/0109199 A1 | 4/2017 | Chen |
| 2017/0109232 A1 | 4/2017 | Cha |
| 2017/0147499 A1 | 5/2017 | Mohan |
| 2017/0161202 A1 | 6/2017 | Erez |
| 2017/0162235 A1 | 6/2017 | De |
| 2017/0168986 A1 | 6/2017 | Sajeepa |
| 2017/0177217 A1 | 6/2017 | Kanno |
| 2017/0177259 A1 | 6/2017 | Motwani |
| 2017/0199823 A1 | 7/2017 | Hayes |
| 2017/0212708 A1 | 7/2017 | Suhas |
| 2017/0220254 A1 | 8/2017 | Warfield |
| 2017/0221519 A1 | 8/2017 | Matsuo |
| 2017/0228157 A1 | 8/2017 | Yang |
| 2017/0242722 A1 | 8/2017 | Qiu |
| 2017/0249162 A1 | 8/2017 | Tsirkin |
| 2017/0255511 A1* | 9/2017 | Lin ........................ G06F 3/064 |
| 2017/0262176 A1 | 9/2017 | Kanno |
| 2017/0262178 A1 | 9/2017 | Hashimoto |
| 2017/0262217 A1 | 9/2017 | Pradhan |
| 2017/0269998 A1 | 9/2017 | Sunwoo |
| 2017/0285976 A1 | 10/2017 | Durham |
| 2017/0286311 A1 | 10/2017 | Juenemann |
| 2017/0322888 A1 | 11/2017 | Booth |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0024779 A1 | 1/2018 | Kojima |
| 2018/0033491 A1 | 2/2018 | Marelli |
| 2018/0052797 A1 | 2/2018 | Barzik |
| 2018/0067847 A1 | 3/2018 | Oh |
| 2018/0074730 A1 | 3/2018 | Inoue |
| 2018/0076828 A1 | 3/2018 | Kanno |
| 2018/0088867 A1 | 3/2018 | Kaminaga |
| 2018/0107591 A1 | 4/2018 | Smith |
| 2018/0143780 A1 | 5/2018 | Cho |
| 2018/0150640 A1 | 5/2018 | Li |

(56) References Cited

U.S. PATENT DOCUMENTS

| | | |
|---|---|---|
| 2018/0165038 A1 | 6/2018 | Authement |
| 2018/0167268 A1 | 6/2018 | Liguori |
| 2018/0173620 A1 | 6/2018 | Cen |
| 2018/0188970 A1 | 7/2018 | Liu |
| 2018/0189182 A1 | 7/2018 | Wang |
| 2018/0212951 A1 | 7/2018 | Goodrum |
| 2018/0219561 A1* | 8/2018 | Litsyn ............... H03M 13/2948 |
| 2018/0226124 A1 | 8/2018 | Perner |
| 2018/0232151 A1 | 8/2018 | Badam |
| 2018/0270110 A1 | 9/2018 | Chugtu |
| 2018/0293014 A1 | 10/2018 | Ravimohan |
| 2018/0294823 A1* | 10/2018 | Li ..................... H03M 13/2906 |
| 2018/0300203 A1 | 10/2018 | Kathpal |
| 2018/0329776 A1 | 11/2018 | Lai |
| 2018/0336921 A1 | 11/2018 | Ryun |
| 2018/0349396 A1 | 12/2018 | Blagojevic |
| 2018/0356992 A1 | 12/2018 | Lamberts |
| 2018/0373428 A1 | 12/2018 | Kan |
| 2018/0373655 A1 | 12/2018 | Liu |
| 2018/0373664 A1 | 12/2018 | Vijayrao |
| 2019/0012111 A1 | 1/2019 | Li |
| 2019/0065085 A1 | 2/2019 | Jean |
| 2019/0073262 A1 | 3/2019 | Chen |
| 2019/0087115 A1 | 3/2019 | Li |
| 2019/0087266 A1* | 3/2019 | Watanabe ......... H03M 13/2909 |
| 2019/0087328 A1 | 3/2019 | Kanno |
| 2019/0103884 A1* | 4/2019 | Kim .................. H03M 13/2915 |
| 2019/0171532 A1 | 6/2019 | Abadi |
| 2019/0205206 A1 | 7/2019 | Hornung |
| 2019/0227927 A1 | 7/2019 | Miao |
| 2019/0272242 A1 | 9/2019 | Kachare |
| 2019/0278654 A1 | 9/2019 | Kaynak |
| 2019/0339998 A1 | 11/2019 | Momchilov |
| 2019/0361606 A1* | 11/2019 | Goker ............... H03M 13/2918 |
| 2019/0377632 A1 | 12/2019 | Oh |
| 2019/0377821 A1 | 12/2019 | Pleshachkov |
| 2019/0391748 A1 | 12/2019 | Li |
| 2020/0004456 A1 | 1/2020 | Williams |
| 2020/0004674 A1 | 1/2020 | Williams |
| 2020/0013458 A1 | 1/2020 | Schreck |
| 2020/0042223 A1 | 2/2020 | Li |
| 2020/0097189 A1 | 3/2020 | Tao |
| 2020/0159425 A1 | 5/2020 | Flynn |
| 2021/0058097 A1* | 2/2021 | Watanabe ......... H03M 13/2927 |
| 2021/0089392 A1* | 3/2021 | Shirakawa .......... G06F 11/1068 |

FOREIGN PATENT DOCUMENTS

| | | |
|---|---|---|
| WO | 9418634 | 8/1994 |
| WO | 1994018634 | 8/1994 |

OTHER PUBLICATIONS

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India, pp. 1-7, 2017, <10.1145/3124680.3124741>. <hal-01654985>.

EMC Powerpath Load Balancing and Failover Comparison with native MPIO operating system solutions. Feb. 2011.

Tsuchiya, Yoshihiro et al. "DBLK: Deduplication for Primary Block Storage", MSST 2011, Denver, CO, May 23-27, 2011 pp. 1-5.

Chen Feng, et al. "CAFTL: A Content-Aware Flash Translation Layer Enhancing the Lifespan of Flash Memory based Solid State Devices" < FAST'11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14https://www.syncids.com/#.

WOW: Wise Ordering for Writes—Combining Spatial and Temporal Locality in Non-Volatile Caches by Gill (Year: 2005).

Helen H. W. Chan et al. "HashKV: Enabling Efficient Updated in KV Storage via Hashing", https://www.usenix.org/conference/atc18/presentation/chan, (Year: 2018).

S. Hong and D. Shin, "NAND Flash-Based Disk Cache Using SLC/MLC Combined Flash Memory," 2010 International Workshop on Storage Network Architecture and Parallel I/Os, Incline Village, NV, 2010, pp. 21-30.

Arpaci-Dusseau et al. "Operating Systems: Three Easy Pieces", Originally published 2015; Pertinent: Chapter 44; flash-based SSDs, available at http://pages.cs.wisc.edu/~remzi/OSTEP/.

Jimenex, X., Novo, D. and P. Ienne, "Pheonix:Reviving MLC Blocks as SLC to Extend NAND Flash Devices Lifetime," Design, Automation & Text in Europe Conference & Exhibition (DATE), 2013.

Yang, T. Wu, H. and W. Sun, "GD-FTL: Improving the Performance and Lifetime of TLC SSD by Downgrading Worn-out Blocks," IEEE 37th International Performance Computing and Communications Conference (IPCCC), 2018.

* cited by examiner

MEMORY-MAPPED TWO-DIMENSIONAL ERROR CORRECTION CODE FOR MULTI-BIT ERROR TOLERANCE IN DRAM

BACKGROUND

Field

This disclosure is generally related to error correction code (ECC) protection in memory devices. More specifically, this disclosure is related to a system and method for facilitating memory-mapped two-dimensional (2D) ECC protection in memory devices.

Related Art

Server-level reliability, availability, and serviceability (RAS) is critical for cloud service providers with respect to a data center's total-cost-of ownership (TCO) and customer service-level agreement (SLA). Soft errors occurring in the server's DRAM are a major source of RAS problems. The soft errors can occur in a memory system when cosmic rays or particles with certain electrical charges hit a memory cell, causing the cell to change state to a different value. However, the physical structure of the memory cell is not damaged and perfectly working. To mitigate the negative effects caused by the soft errors, most modern server-class memories (e.g., dynamic random-access memories (DRAMs)) are protected by error correction codes (ECCs) with the capability of single-error correction and double-error detection (SECDED). However, SECDED becomes insufficient as the occurrences of multi-bit errors in future DRAM devices increase due to increased memory capacity and lowered operation voltage. The memory capacity of modern servers has reached beyond 256 GB per server node. On the other hand, the operating voltage of DRAM drops as the DDR (double data rate) generations evolve, resulting in more susceptibility to soft errors. For example, DDR3 has an operating voltage of 1.5-1.65 V. In comparison, the operating voltages of DDR4 and DDR5 are 1.2-1.4 V and ~1.1 V, respectively. More advanced error-correction techniques are needed to ensure server reliability.

SUMMARY

One embodiment described herein provides a system and method for facilitating error-correction protection in a storage device. During operation, in response to a write request, the system organizes a block of data to be written to the storage device in a two-dimensional (2D) array, forms a plurality of first-dimension sub-blocks by dividing the 2D array along a first dimension, and forms a plurality of second-dimension sub-blocks by dividing the 2D array along a second dimension. In response to determining that second-dimension error correction code (ECC) encoding is enabled, the system performs second-dimension ECC encoding on the second-dimension sub-blocks to generate a set of second-dimension ECC bits and performs first-dimension ECC encoding on the first-dimension sub-blocks and the second-dimension ECC bits to generate a set of first-dimension ECC bits. The system then writes the data block along with the second-dimension ECC bits and the first-dimension ECC bits to the storage device. The data block and the second-dimension ECC bits are mapped to separate physical addresses in the storage device.

In a variation on this embodiment, forming a respective second-dimension sub-block can include concatenating a portion of data from a first first-dimension sub-block with a corresponding portion of data from an adjacent first-dimension sub-block.

In a variation on this embodiment, the second-dimension ECC encoding is configured to provide a stronger error-correction protection than the first-dimension ECC encoding.

In a further variation, the block of data can be 64-bytes long, and a respective first-dimension sub-block and a respective second-dimension sub-block each can be 64-bits long. Performing the first-dimension ECC encoding can include computing eight ECC bits for each first-dimension sub-block, and performing the second-dimension ECC encoding can include computing 16 ECC bits for each second-dimension sub-block.

In a further variation, the first-dimension ECC encoding is configured to provide single-bit error correction and double-bit error detection (SECDED), and the second-dimension ECC encoding is configured to provide double-bit error correction and triple-bit error detection (DECTED).

In a variation on this embodiment, the system determines a physical address included in the write request, and determines whether the physical address is within a region of the storage device configured to be protected by the second-dimension ECC encoding by looking up an address-mapping table. In response to determining that the physical address is within a region of the storage device configured to be protected by the second-dimension ECC encoding, the system sets a second-dimension ECC encoding enable bit and calculates a second-dimension ECC address to which the second-dimension ECC bits are mapped.

In a further variation, in response to determining that the physical address is not within a region of the storage device configured to be protected by the second-dimension ECC encoding, the system clears the second-dimension ECC encoding enable bit.

In a variation on this embodiment, in response to a read request and determining that second-dimension ECC decoding is enabled, the system reads the data block along with the second-dimension ECC bits and the first-dimension ECC bits from the storage device. The system then performs first-dimension ECC decoding for the data block and the second-dimension ECC bits based on the first-dimension ECC bits.

In a further variation, in response to a read request and determining that the second-dimension ECC decoding is disabled, the system reads the data block along with the second-dimension ECC bits and the first-dimension ECC bits from the storage device and performs first-dimension ECC decoding for the data block only based on corresponding ECC bits included in the first-dimension ECC bits. The system then outputs the data block decoded using the first-dimension ECC decoding.

In a further variation, in response to determining that the first-dimension ECC decoding corrects all errors in the data block, the system outputs the data block decoded using the first-dimension ECC decoding. In response to determining that the first-dimension ECC decoding fails to correct all errors in the data block, the system performs second-dimension decoding for the data block based on the second-dimension ECC bits and outputs the data block decoded using the second-dimension ECC decoding.

One embodiment described herein provides a controller for facilitating error-correction protection in a storage device. The controller includes a data serializer configured to serialize a block of cache line data to a two-dimensional (2D) array. Each row in the 2D array forms a first-dimension sub-block. The controller includes a data-arranging unit configured to form a plurality of second-dimension sub-blocks by dividing the 2D array along a second dimension; a second-dimension error correction code (ECC) encoder configured to, in response to being enabled, perform second-dimension ECC encoding on the second-dimension sub-blocks to generate a set of second-dimension ECC bits; a first-dimension ECC encoder configured to perform first-dimension ECC encoding on first-dimension sub-blocks of the cache line data block and the second-dimension ECC bits to generate a set of first-dimension ECC bits; and a data-sending unit configured to send the data block along with the second-dimension ECC bits and the first-dimension ECC bits to the storage device. The data block and the second-dimension ECC bits are mapped to separate physical addresses in the storage device.

BRIEF DESCRIPTION OF THE FIGURES

In the figures, like reference numerals refer to the same figure elements.

DETAILED DESCRIPTION

Figure 1A:
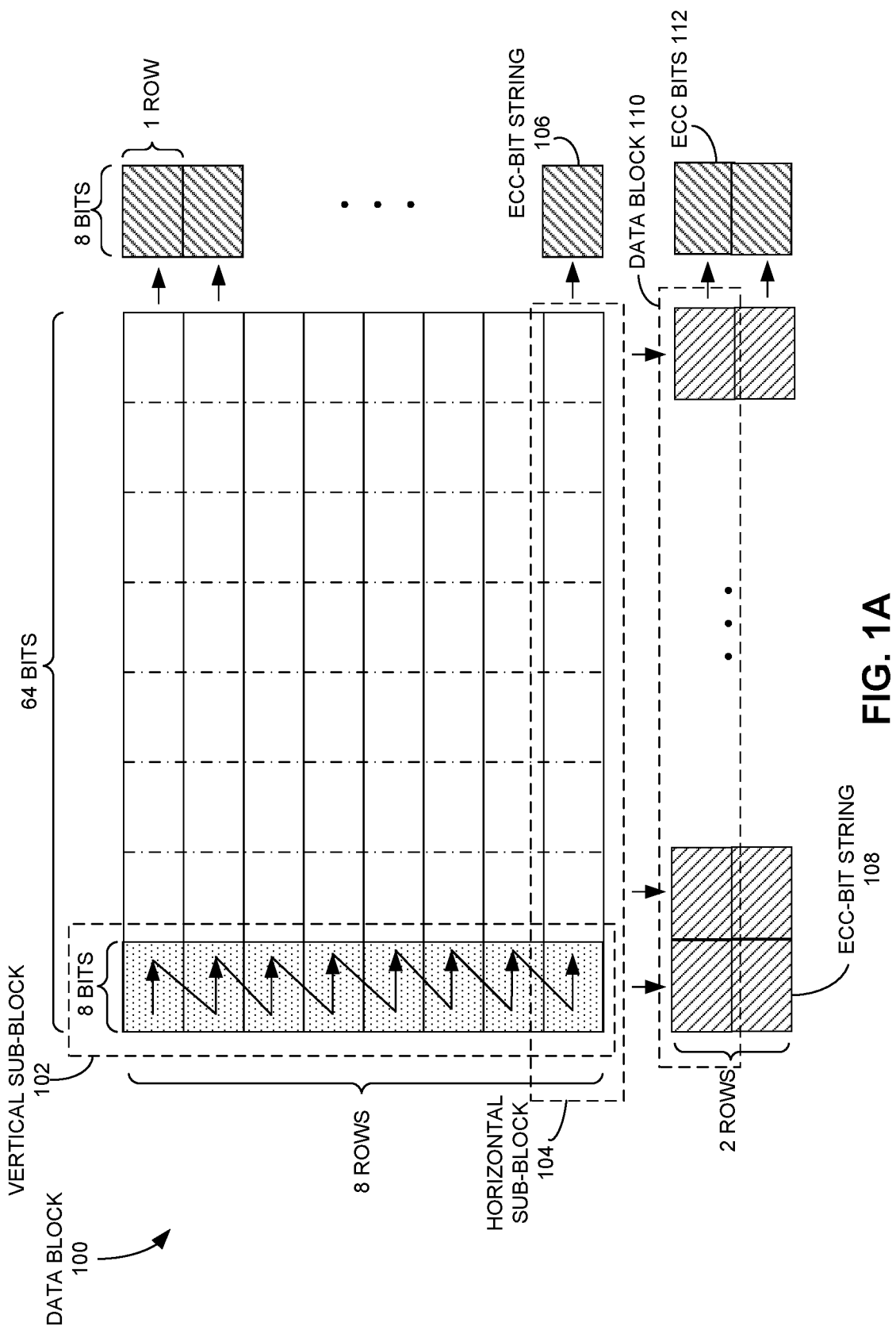
FIG. 1A presents a diagram illustrating an exemplary data-arrangement scheme, according to one embodiment.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

In this disclosure, a method and system are presented for facilitating memory-mapped two-dimensional (2D) error-correction code (ECC) protection in memory devices. When a memory controller receives a block of cache line data to be stored in the memory, it can serialize the data into a 2D array and divide the data block into sub-blocks using two different ways, such as a horizontal division (which results in horizontal sub-blocks) and a vertical division (which results in vertical sub-blocks). The memory controller can then apply a first type of ECC protection on the horizontal sub blocks and a second type of ECC protection on the vertical sub-blocks, with the ECC protection on the vertical sub-blocks being stronger than that on the horizontal sub-blocks. After encoding, the resulting vertical ECC bits can be mapped to physical addresses in the memory like regular data. When the data are retrieved from the memory, the memory controller first applies the horizontal ECC decoding. If soft errors included in the data can be corrected by the horizontal ECC decoding, there is no need to apply the vertical ECC decoding. However, if the number of soft errors included in the data is beyond the error-correction capability of the horizontal ECC, the system needs to apply the vertical ECC decoding on the vertical sub-blocks. Because vertical ECC decoding is only invoked when needed, the system does not incur excessive amounts of latency.

Memory-Mapped 2D ECC

A number of advanced error-correction techniques have been implemented in memory devices to improve server availability. Many existing methods resort to data remapping or duplication. For example, a data-remapping technology scatters bits of an ECC word across multiple memory chips, such that the failure of any single memory chip will affect only one ECC bit per word. However, when the errors are more uniformly distributed across memory chips, such remapping technology becomes less effective. A memory-mirroring technology relies on memory duplication, where a range up to half of the memory is duplicated in the DRAM available in the system and, when the soft errors are beyond ECC capability, a mirrored copy of the data is used. However, this is a very expensive RAS feature, because it costs up to half of the memory capacity.

There are also other forms of ECC. Notably, morphable ECC (MECC) is a recently proposed ECC technique, which combines SECDED and ECC-6 to provide multi-bit error correction at the cache line granularity. However, this form of ECC has limited error-correction capability due to the constraint of the available number of ECC bits. When implementing MECC, the system stores the ECC bits for the 64-byte block in a 64-bit field traditionally used for 8-byte blocks. The system also uses the leftmost four bits in the ECC field as the ECC-mode bits to identify which level of ECC (e.g., ECC-6) the current 64-byte block of data is using. However, MECC is geared toward reducing the number of DRAM refreshing operations in order to reduce DRAM power consumption in mobile systems, and has some fundamental problems when it comes to improving the DRAM reliability in data centers. First, it incurs a noticeable increase in memory access latency. Unlike the traditional 8-byte ECC protection scheme, where the ECC checking can be overlapped with the following transfer of 8-byte data, MECC performs ECC checking at the end of the 64-byte data transfer (with 64 bytes being the cache line size); therefore, none of the ECC checking latency can be partially hidden in the transfer of a cache line. Second, MECC is a hardware solution and is transparent to the software, thus making it incompatible with data center applications. A data center needs to be aware of the soft-error rate of its memory system in order to take proactive actions, such as disabling the failing DRAM or migrating the applications away from a failing node, to prevent service disruption. Moreover, MECC only supports up to 6-bit error correction at the cache line level due to the 64-bit constraint in the ECC field. Its error-correction density is less than that of conventional SECDED, which is 1 error correction per 64 bits. This means MECC could not scale the error-correction capability Additional novel ECC techniques also include memory-mapped ECC, which can reduce the storage cost of ECC bits on the last-level caches (LLC). It essentially breaks the ECC into two tiers, with the first tier (T1EC) for low-cost fast error detection and the second tier (T2EC) for strong error correction. Since T2EC requires a relatively large storage capacity, it is stored in the DRAM instead of the cache, and it is only retrieved when T1EC detects errors. However, the memory mapping of T2EC is specifically designed for LLC, which uses sets and ways to derive the mapping address, and cannot be directly applied to DRAMs.

Similarly, two-dimensional (2D) ECC has been designed to reduce the cache area cost of multi-bit error correction by introducing vertical coding in addition to the SECDED horizontal coding. It works on an n×n data block, and the vertical coding is applied on every n-bit data block at each column. The vertical coding is typically stronger than the horizontal coding and, therefore, is only used when the soft-error rate goes beyond the capability of horizontal ECC. This approach is purely based on hardware and works only for caches.

To provide stronger ECC protection in the memory system of a data center, in some embodiments, a 64-byte data block can be encoded in both the horizontal and vertical directions. The vertical encoding uses a stronger ECC (e.g., having a longer ECC-bit string) that can correct double-bit errors and detect triple-bit errors, in addition to the conventional horizontal ECC, which is weaker and has a shorter ECC-bit string. The vertical ECC bits can be mapped to the physical memory address space just like regular data. When data in the memory is read, the system determines whether the horizontal ECC alone is sufficient to correct all errors in the data block. If so, only the horizontal ECC bits will be processed for error correction and no additional latency will be incurred. If not, the vertical ECC bits will also be processed to provide stronger error correction.

FIG. 1A presents a diagram illustrating an exemplary data-arrangement scheme, according to one embodiment. In FIG. 1A, a 64-byte data block 100 (which is the cache line width) can be arranged into a data array having the size of 64 bits×8, with each row having 64 bits and eight such rows vertically aligned and stacked. Data block 100 can further be divided into eight sub-blocks, referred to as vertical sub-blocks, along its horizontal direction, such as vertical sub-block 102. Each vertical sub-block can include eight rows, with eight bits in each row. Data in each vertical sub-block can be rearranged such that the eight shows of the 8-bit data are sequentially concatenated to create a new block of 64 bits. The zigzagged arrows illustrate how the rows are concatenated. On the other hand, each row of data block 100 can be referred to as a horizontal sub-block, such as horizontal sub-block 104.

FIG. 1A also shows the ECC-bit string for each horizontal sub-block, such as ECC-bit string 106 that provides protection for horizontal sub-block 104. In some embodiments, the ECC used to protect each horizontal sub-block can be a standard ECC technique used for cache lines, where eight ECC bits (which can be referred to as the horizontal ECC bits in this disclosure) are used to protect the 64 data bits in each horizontal sub-block. On the other hand, each vertical sub-block, which also has 64 bits, can be protected by a stronger ECC. In some embodiments, the 64-bit vertical sub-block can be protected by at least 16 ECC bits, as shown in FIG. 1A. More specifically, the ECC bits for each vertical sub-block can be arranged in two rows, with each row having eight ECC bits and being vertically aligned with the corresponding vertical sub-block. For example, ECC-bit string 108 provides protection for vertical sub-block 102 and its two rows are vertically aligned with the rows of vertical sub-block 102.

In some embodiments, the ECC bits of the vertical sub-blocks (which can be referred to as the vertical ECC bits in this disclosure) can be treated as the same regular data; that is, these vertical ECC bits will be stored and mapped to physical addresses in the memory just like regular data. This also means that these vertical ECC bits require protection just like regular data. In the example shown in FIG. 1A, the top or bottom row of the vertical ECC bits of all vertical sub-blocks can sequentially align horizontally to form a data block that is similar to the aforementioned horizontal sub-block. Such a data block can be similarly protected by eight horizontal ECC bits. For example, the top row of all vertical sub-blocks forms a data block 110, which is protected by eight ECC bits 112.

Figure 1B:
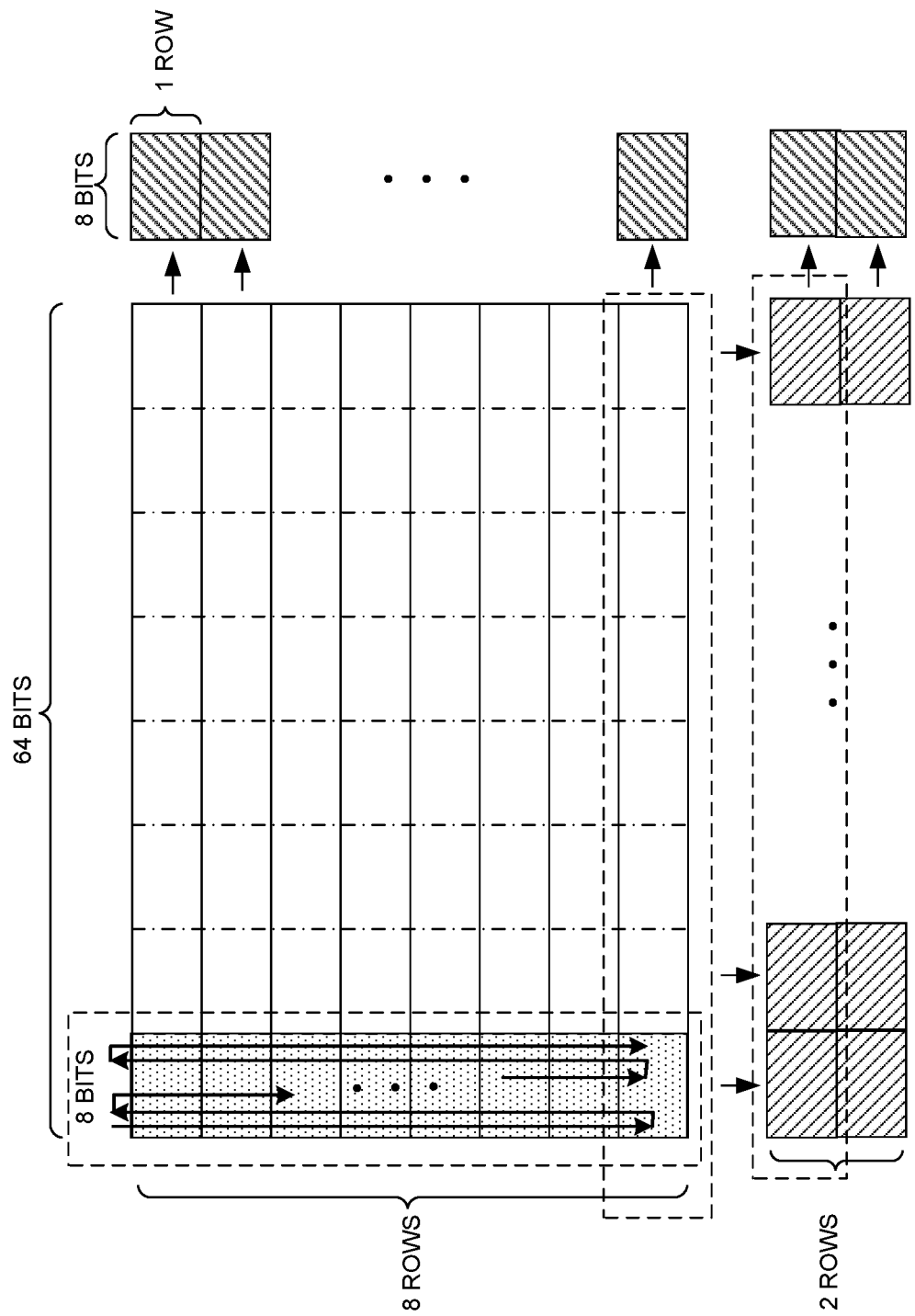
FIG. 1B presents a diagram illustrating a different data-arrangement scheme, according to one embodiment.

In addition to concatenating or interleaving the eight rows of 8-bit data to form the 64-bit vertical sub-block as shown in FIG. 1A, other data-arrangement methods can also be used. FIG. 1B presents a diagram illustrating a different data-arrangement scheme, according to one embodiment. In the example shown in FIG. 1B, the data concatenation is performed for the eight columns of data. In other words, the eight columns of 8-bit data are concatenated or interleaved to form the 64-bit vertical sub-block. In addition, the system may choose to interleave every two or four bits from each horizontal sub-block. Other types of data arrangement can also be possible, as long as the division of the data in one direction is not the same as the division of the data in the other direction. It is preferable that one sub-block in one direction include portions of data from all sub-blocks in the other direction.

Figure 2:
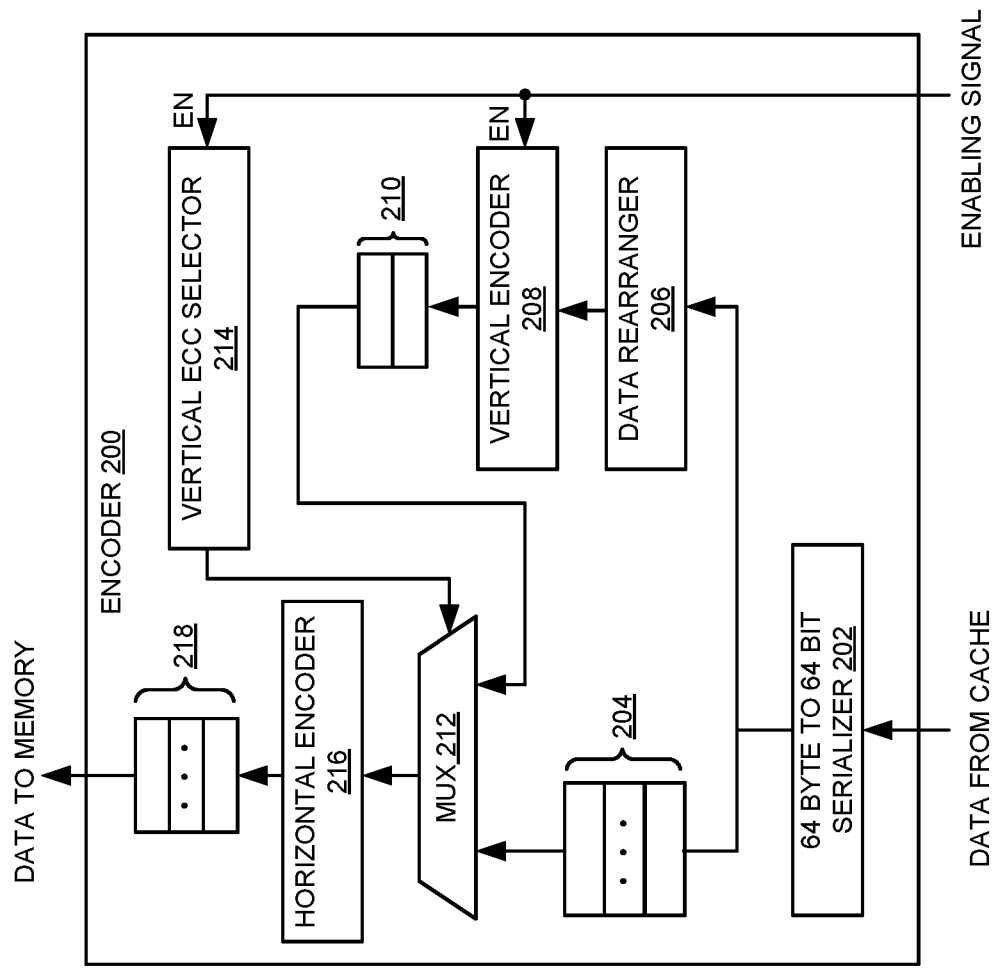
FIG. 2 illustrates an exemplary encoder for encoding data blocks to facilitate multi-bit error correction, according to one embodiment.

FIG. 2 illustrates an exemplary encoder for encoding data blocks to facilitate multi-bit error correction, according to one embodiment. Encoder 200 can include a serializer 202 that can serialize incoming data from the last level cache (LLC). In some embodiments, the cache line size can be 64 bytes, and serializer 202 can serialize the 64-byte cache line data into eight 64-bit data chunks.

Encoder 200 can include a data buffer 204 that buffers the copy of the serialized data chunks. The other copy of the serialized data chunks can be sent to a data rearranger 206 that rearranges the serialized data chunks into vertical sub-blocks. More specifically, for each serialized data chunk (which can include 64 bits), data rearranger 206 can first buffer the 64-bit data chunk and then split the 64 bits into eight 8-bit chunks. After all eight serialized data chunks have been processed, data rearranger 206 can vertically align corresponding 8-bit chunks from the eight serialized data chunks (one 8-bit chunk per serialized data chunk) and concatenates these 8-bit chunks to form a vertical sub-block in a way similar to what is shown in FIG. 1A.

Encoder 200 can include a vertical encoder 208 that can encode the vertical sub-blocks. In some embodiments, vertical encoder 208 can encode the vertical sub-blocks using a relatively stronger ECC, such as using 16 ECC bits to protect a 64-bit vertical sub-block. This stronger ECC can have the capability to correct double-bit errors (e.g., double-bit error correction and triple-bit error detection (DECTED)). An enabling signal provided by an address controller, which will be discussed in more detail later, can enable operations of vertical encoder 208. The encoding outcome, i.e., the vertical ECC bits, can be buffered into a data buffer 210. In some embodiments, vertical encoder 208 can generate 128 vertical ECC bits for the eight vertical sub-blocks, and data buffer 210 can be a two-entry buffer, with each entry storing 64 vertical ECC bits. More particularly, each buffer entry corresponds to a row of vertical ECC bits, such as row 110 shown in FIG. 1A or FIG. 1B. A multiplexer (MUX) 212 can be used to combine, sequentially, the serialized data blocks with the vertical ECC bits. To ensure the correct ordering between the serialized data chunks and the vertical ECC bits, encoder 200 can also include a vertical ECC selector 214 that, when enabled by the same signal enabling vertical encoder 208, can generate a select signal to allow entries stored in buffer 210 to be combined sequentially with the serialized data blocks. More specifically, each set of vertical ECC bits is aligned with the corresponding vertical sub-block.

The aligned blocks, including the original serialized eight 64-bit data chunks and the vertical ECC bits (two rows of 64-bit data), can then be sent, sequentially, to horizontal encoder 216, with each 64-bit data chunk or row being a horizontal sub-block shown in FIG. 1A. In some embodiments, horizontal encoder 216 encodes each horizontal sub-block using a relatively weaker ECC, such as using eight ECC bits to protect each 64-bit horizontal sub-block, which can be the serialized data or the vertical ECC bits that are aligned to the serialized data. An exemplary ECC can be the (72, 64) Hamming code. The weaker ECC has the ability to correct a single bit error (e.g., SECDED). The horizontal sub-blocks can be similar to data blocks 104 and 110 shown in FIG. 1A. Horizontal encoder 216 can be similar to a conventional ECC encoder implemented in a conventional memory controller, with the ECC bits being stored in designated ECC fields. Outputs of horizontal encoder 216 can be stored in data buffer 218 before being sent to the memory device (e.g., the DRAM). More specifically, as shown in FIG. 1A or 1B, after encoding, each 64-byte data block can be rearranged and augmented to have ten rows, with the first eight rows including the original data and their horizontal ECC bits and the last two rows including the vertical ECC bits and their corresponding horizontal ECC bits. The entire ten rows of data, including the vertical ECC bits along with their corresponding horizontal ECC bits, are stored in the memory. This means that the vertical ECC bits need to be mapped into the physical memory space like regular data. Additional address mapping and tracking will be needed to ensure that the memory controller is aware of the storage location of the vertical ECC bits.

Figure 3:
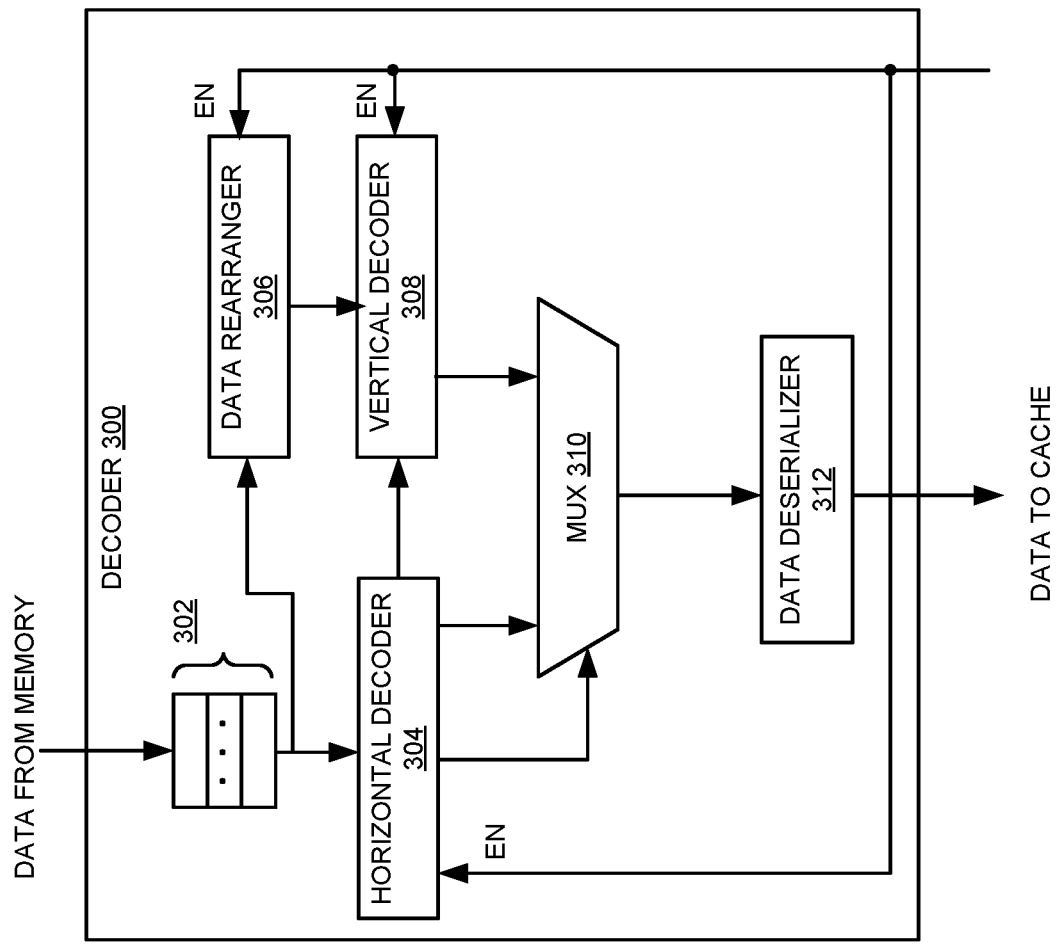
FIG. 3 illustrates an exemplary decoder that facilitates multi-bit error correction, according to one embodiment.

FIG. 3 illustrates an exemplary decoder that facilitates multi-bit error correction, according to one embodiment. Decoder 300 can include a buffer 302 for buffering data retrieved from the memory. The data retrieved from the memory arrives at decoder 300 in the form of horizontal sub-blocks, with each horizontal sub-block including 64 bits of data and eight horizontal ECC bits. Decoder 300 can include a horizontal decoder 304 for achieving ECC decoding for each horizontal sub-block. Note that, when vertical decoding is enabled, horizontal decoder 304 also decodes the vertical ECC bits received from the memory. However, if the number of errors in the data is within the error-correction capability provided by horizontal decoder 304 (e.g., only including single-bit errors), these vertical ECC bits will be ignored. On the other hand, if the number of errors is beyond the error-correction capability of horizontal decoder 304 (e.g., including double-bit errors), horizontal decoder 304 decodes the vertical ECC bits and makes necessary corrections. Decoder 300 can include a data rearranger 306 that can be enabled when the vertical decoding is enabled. Data rearranger 306 can rearrange the incoming data into vertical sub-blocks and also align each vertical sub-block with its corresponding vertical ECC bits in a way similar to what is shown in FIG. 1A or 1B.

Decoder 300 includes a vertical decoder 308 that can perform ECC decoding for the rearranged vertical sub-blocks. Note that the vertical ECC bits needed for vertical decoding are provided by horizontal decoder 304, because those vertical ECC bits are also protected by the horizontal ECC, as shown in FIG. 1A or 1B. The output of vertical decoder 308 and the output of horizontal decoder 304 can be sent to a MUX 310, which can select either the output of horizontal decoder 304 or the output of vertical decoder 308 to send to data deserializer 312. Note that horizontal decoder 304 sends a select signal to MUX 310 in response to its determination on whether the number of errors included in the data exceeds its own error-correction capability. As discussed before, when the number of errors in the retrieved data exceeds its own error-correction capability, horizontal decoder 304 decodes the vertical ECC bits and sends the vertical ECC bits to vertical ECC decoder 308 for vertical decoding and multi-bit (e.g., double-bit) error correction. At the same time, horizontal decoder 304 can send the select signal to MUX 310 to select the output of the vertical decoder 308. Data deserializer 312 can pack the corrected data into a 64-byte block and feed the 64-byte data block to the cache. Note that, if vertical decoder 308 is not enabled but the number of errors in the retrieved data is beyond the error-correction capability of horizontal decoder 304, a DRAM error will be raised, and the operating system will be notified via the system's error-handling mechanism, such as the Machine Check Architecture (MCA).

As one can see from the decoder design shown in FIG. 3, when the vertical decoder is not enabled (e.g., when the particular data block is not protected with vertical ECC), the data access latency is not affected, because only regular horizontal ECC decoding is performed. On the other hand, if the vertical decoder is enabled but the vertical decoding operation is not invoked, because the number of errors is within the error-correction capability of the horizontal decoder, the access latency for the data is only slightly affected (e.g., due to the need to access the vertical ECC bits that may reside in a different row buffer). If vertical decoding is invoked, because the number of errors is beyond the error-correction capability of the horizontal decoder, additional data access latency will be introduced (e.g., due to the need to perform the vertical decoding operation). The different levels of latency increase can provide a vehicle to gracefully trade off the performance with DRAM reliability.

The ECC encoder and decoder can be located within the memory controller, which manages the flow of data going to and from the memory. Moreover, the memory controller can be responsible for enabling and disabling the vertical encoder/decoder. For example, the memory controller can maintain an ECC mapping table that includes a number of entries corresponding to a number of regions that are supported by the 2D ECC scheme. When data is written to or read from the memory, the memory controller can determine whether to enable the vertical encoder/decoder based on the physical memory address included in the memory access request and entries in the ECC mapping table. When writing data to the memory, if the vertical encoder is enabled, the memory controller can allocate physical memory spaces to hold the vertical ECC bits and record the address mapping. When reading data from the memory, if the vertical decoder is enabled, the memory controller retrieves the vertical ECC bits from the corresponding memory location to facilitate vertical decoding when such decoding is needed.

Figure 4A:
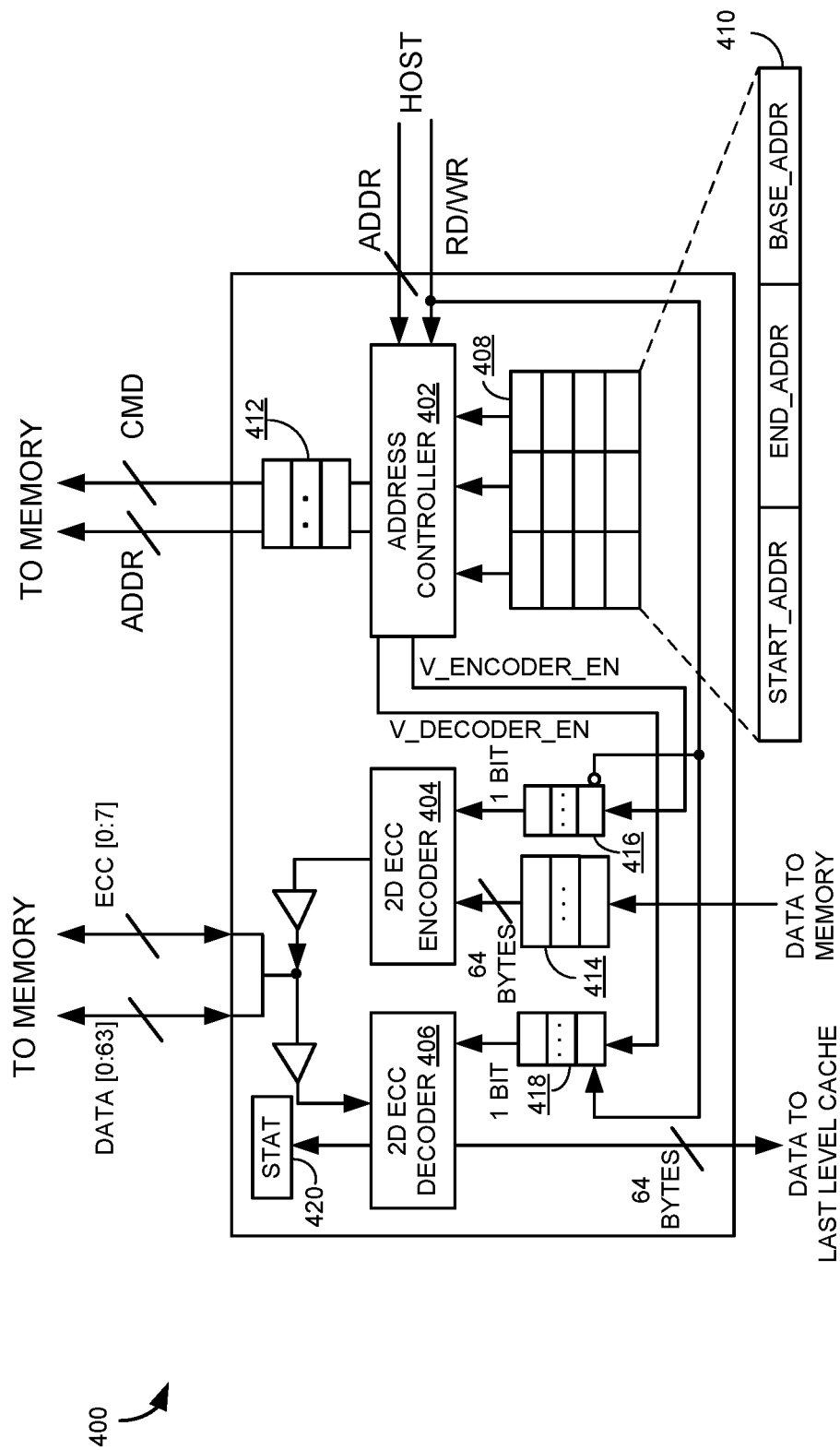
FIG. 4A illustrates an exemplary memory controller that facilitates the implementation of memory-mapped 2D ECC, according to one embodiment.

FIG. 4A illustrates an exemplary memory controller that facilitates the implementation of memory-mapped 2D ECC, according to one embodiment. Memory controller 400 can include a number of components that are involved in the ECC implementation, including an address controller 402, a 2D ECC encoder 404, and a 2D ECC decoder 406. Note that other memory controller components that are not involved in the ECC operation are not shown in FIG. 4A.

Address controller 402 can maintain an ECC mapping table 410 that maps memory regions protected by the vertical ECC to the physical memory address of the vertical ECC bits. Mapping table 410 can include a plurality of entries, with each entry corresponding to a mapped region that the system is designed to protect. More specifically, each entry in mapping table 410 can include three fields, a start_address field, an end_address field, and a base_address field. The start_address and end_address fields include the start and end addresses, respectively, of a memory region that is designed to be protected by the stronger vertical ECC. The base_address field can include the current physical base address of the memory-mapped vertical ECC. Note that, depending on the size of the vertical ECC protected region, the least significant n bits of the base address can be zero, and the vertical ECC address can be calculated as follows: Vertical_ECC_Address=Base_Address+Requested_Address & ($2^n-1$). In some embodiments, the base address field can define a physical address that separates the memory region between the start_address and the end_address into two sub-regions, with one sub-region already protected using vertical ECC and the other sub-region ready to be protected.

The number of vertical ECC entries in mapping table 410 can be implementation-specific. More entries allow more separate memory regions to be protected by the vertical ECC, thus improving reliability. However, protecting a large number of separate memory regions using vertical ECCs can lead to more address comparison operations for each DRAM access, which can increase the latency and/or the complexity of the memory controller. In some embodiments, entries in ECC mapping table 410 can be exposed to the operating system as Machine Specific Registers (MSR), and can be accessed using rdmsr/wrmsr instructions by the operating system. The operating system can manage ECC mapping table 410 by allocating the address ranges for vertical ECC protection based on the criticality or error statistic associated with each address range. In other words, mission-critical memory regions or memory regions prone to soft errors can be protected by the vertical ECC.

Figure 5:
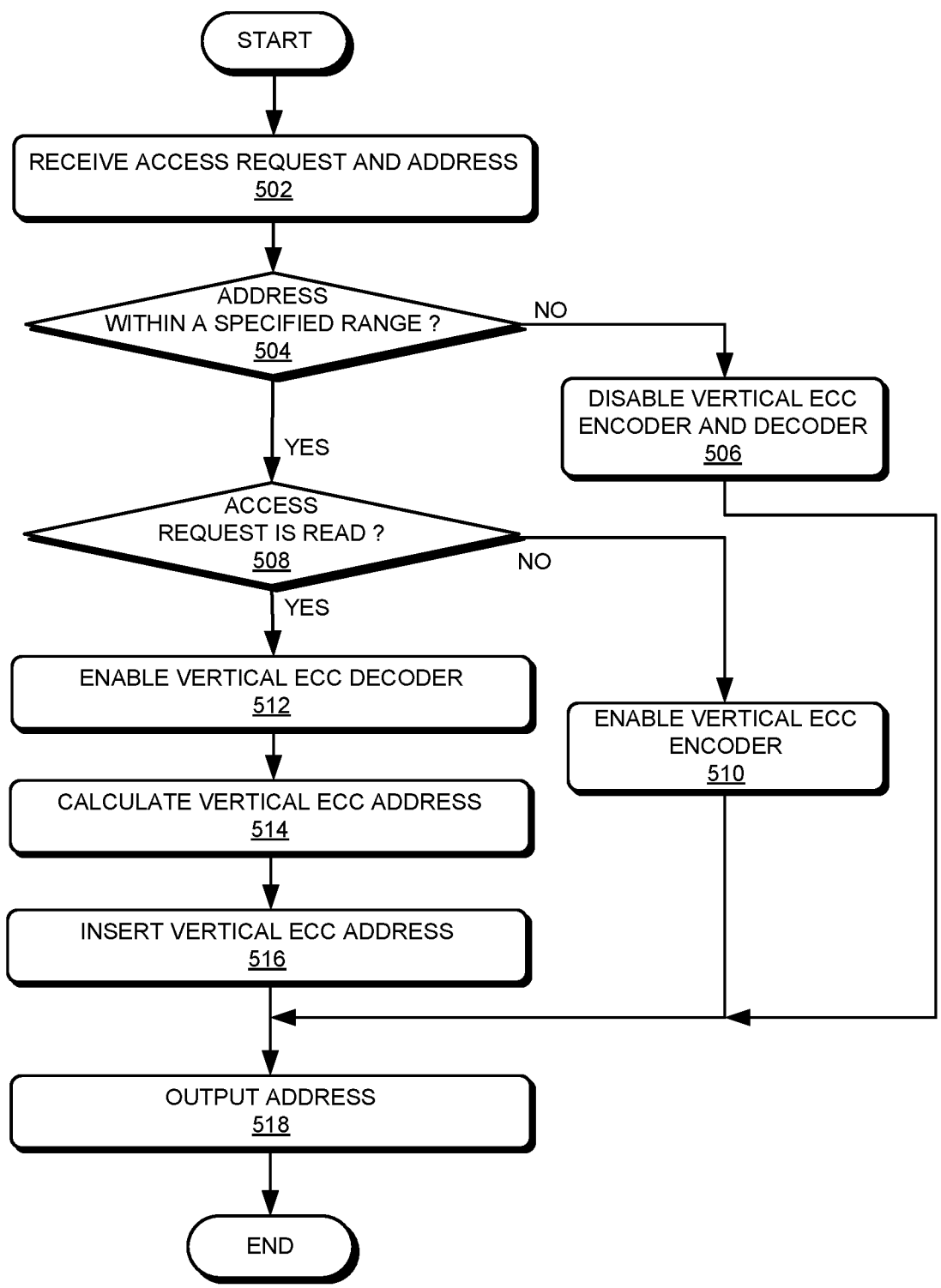
FIG. 5 presents a flowchart illustrating exemplary operations of the address controller, according to one embodiment.

FIG. 5 presents a flowchart illustrating exemplary operations of the address controller, according to one embodiment. During operation, the address controller receives a memory-access command from the host (operation 502). The memory-access command can include an address (which can include multiple address bits) and a single bit indicating whether the command is a read request or a write request, as shown in FIG. 4A. The address controller looks up the ECC mapping table to determine whether the address is within a particular range specified by an entry in the ECC mapping table (operation 504). If not, the requested address falls within a memory region that is not protected by the vertical ECC. As a result, the address controller disables both the vertical ECC encoder and the vertical ECC decoder, e.g., by setting their corresponding enabling signal to low or 0 (operation 506). If the address is within a particular range specified by an entry in the ECC mapping table, the address controller further determines if the access request is a read request (operation 508). If not, the access request is a write request, and the memory controller enables the vertical encoder, e.g., by setting the corresponding enabling signal to high or 1 (operation 510). If the access request is a read request, the memory controller enables the vertical decoder, e.g., by setting the corresponding enabling signal to high or 1 (operation 512).

Subsequent to enabling the vertical encoder or decoder, the address controller calculates the vertical ECC address, which corresponds to the memory location storing the vertical ECC bits (operation 514). The address controller can then insert the vertical ECC address after the address included in the read/write request (operation 516). The address controller can then output the address, which can include the vertical ECC address when applicable (operation 518). These addresses will be sent to the memory to facilitate the memory read/write operation.

Returning to FIG. 4A, the output of address controller 402, which can include the address in the read/write request followed by the calculated vertical ECC address (when applicable) along with the command (read/write?) can be placed in a buffer 412 before being sent to the memory.

FIG. 4A also shows that to-be-written data are queued in a buffer 414 before being inputted to 2D ECC encoder 404. The width of buffer 414 can be the same as the cache line width. In the example shown in FIG. 4A, the width of buffer 414 is 64 bytes. The corresponding vertical ECC enabling signal or bit generated by address controller 402 can be queued in a 1-bit buffer 416. 2D ECC encoder 404 can be similar to encoder 200 shown in FIG. 2. The output of the encoder, including the 64 bits of data (which can be a horizontal sub-block or a row of vertical ECC bits) and the eight horizontal ECC bits, can be sent to the memory. Note that the interface between memory controller 400 and the memory can be the same as a conventional memory controller that only implements the horizontal ECC. The stronger vertical ECC does not require any change to the memory interface or to the width of the memory, because the vertical ECC bits are stored in the memory just like data.

On the other hand, data read from the memory can be sent to 2D ECC decoder 406 via the interface between the memory and memory controller 400. The enabling signal or bit for the vertical ECC decoder can be queued in a 1-bit buffer 418. 2D ECC decoder 406 can be similar to ECC decoder 300 shown in FIG. 3. Note that the vertical ECC is not always active in 2D ECC decoder 406 when the vertical ECC enabling signal is high. If the horizontal decoder within 2D ECC decoder 406 can correct all errors, the vertical ECC bits included in the read data will be ignored. The output of 2D ECC decoder 406 can be sent to the LLC. The width of the output of 2D ECC decoder 406 can be the same as that of the cache line. In the example shown in FIG. 4A, the width of the output of 2D ECC decoder 406 can be 64 bytes. Similarly, the interface between memory controller 400 and the LLC can be a standard interface.

Memory controller 400 can also include a statistics module 420 that gathers statistics information regarding soft errors in the memory from 2D ECC decoder 406. Such information can be used by the CPU to determine which memory regions are more prone to soft errors and may need the additional protection from the vertical ECC.

Figure 4B:
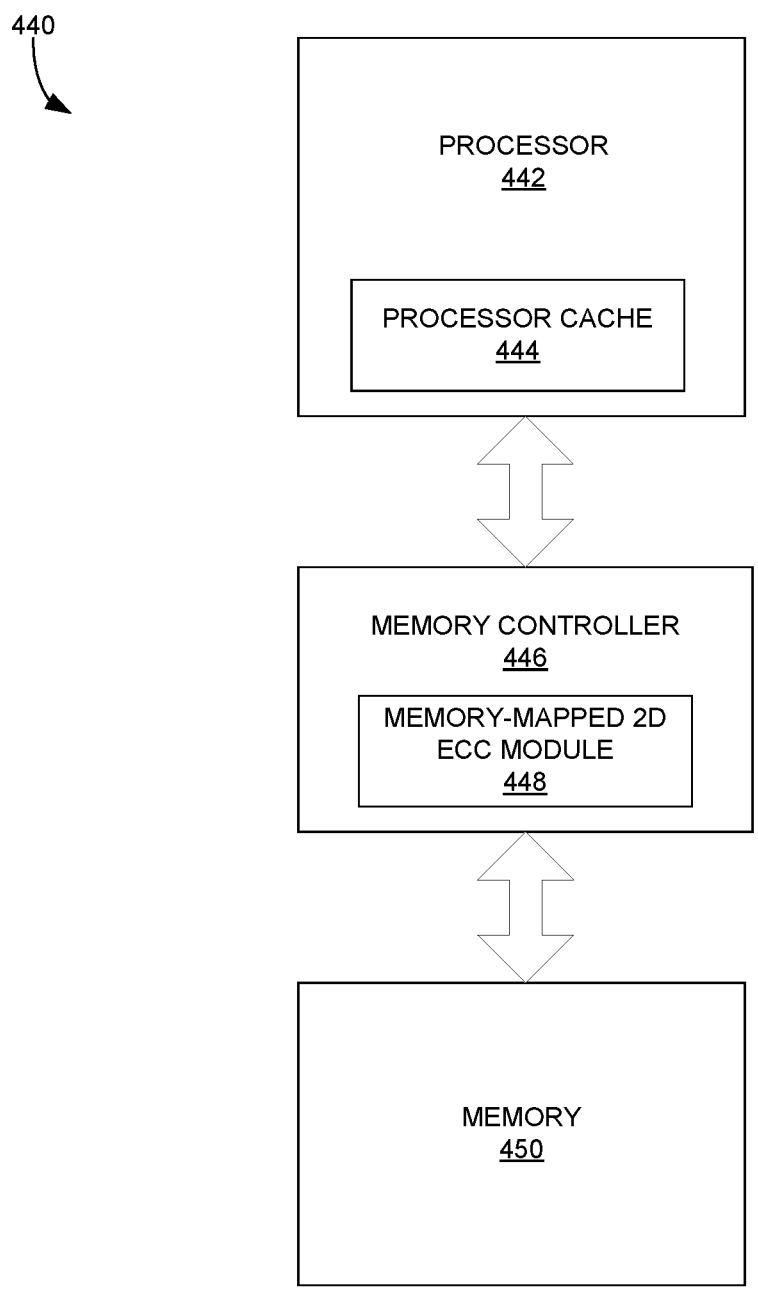
FIG. 4B illustrates an exemplary system that facilitates the implementation of memory-mapped 2D ECC, according to one embodiment.

FIG. 4B illustrates an exemplary system that facilitates the implementation of memory-mapped 2D ECC, according to one embodiment. In FIG. 4B, a system 440 can include a processor 442 that includes a processor cache 444, a memory controller 446, and a memory 450. Processor 442 can send memory-access commands to memory controller 446, which then communicates those commands to memory 450 and organizes data that flows in and out of memory 450. A memory-mapped 2D ECC module 448 can be part of memory controller 446 to facilitate the encoding/decoding operations of the memory-mapped 2D ECC. The internal structure of memory-mapped 2D ECC module 448 can be similar to what is shown in FIG. 4A. The interface between memory controller 446 and processor 442 and the interface between memory controller 446 and memory 450 can include standard memory controller interfaces. In FIG. 4B, memory controller 446 is shown as a standalone unit. In practice, it is also possible that memory controller 446 is integrated onto the same chip with processor 442.

Figure 6:
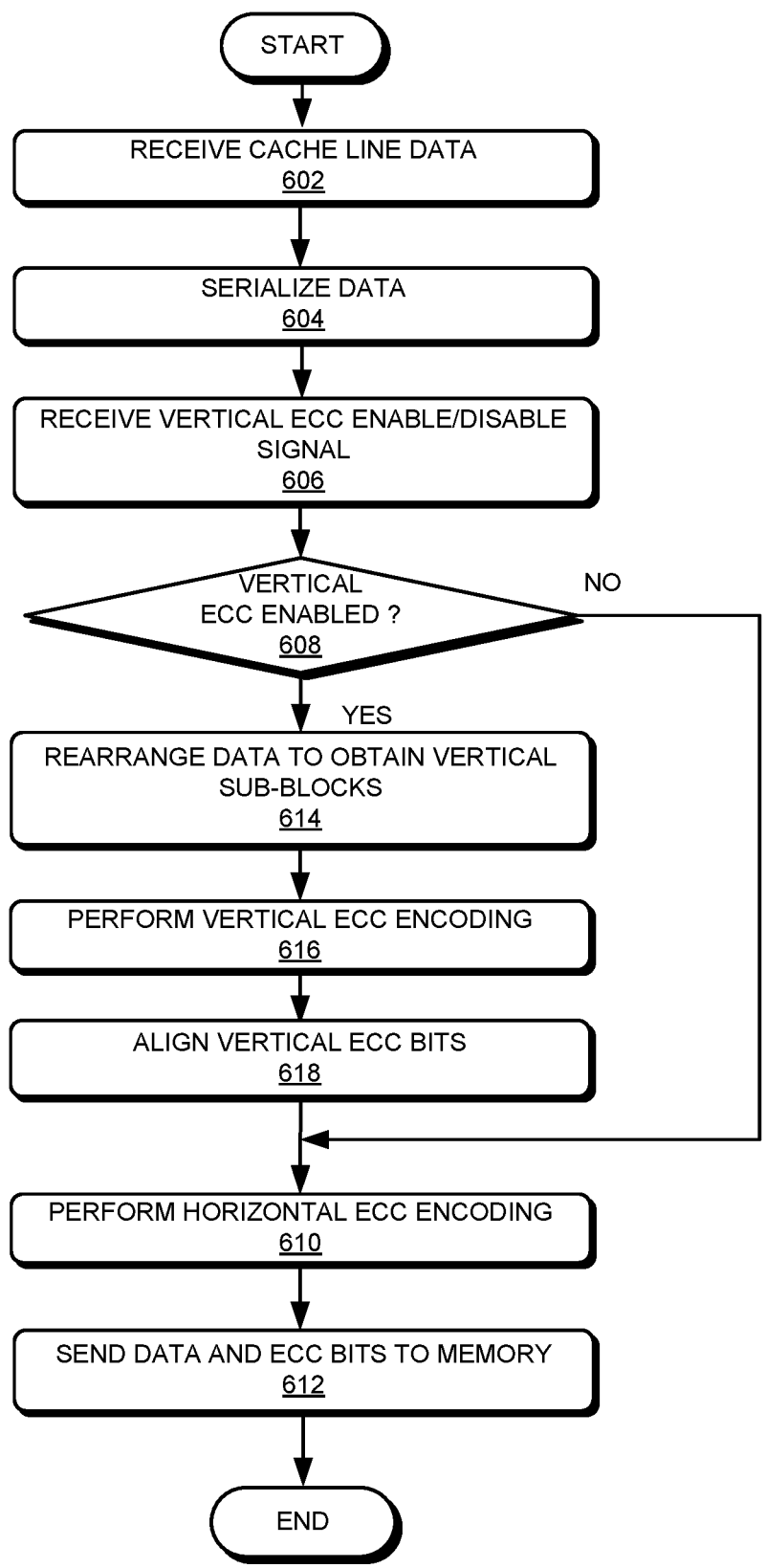
FIG. 6 presents a flowchart illustrating an exemplary write operation, according to one embodiment.

FIG. 6 presents a flowchart illustrating an exemplary write operation, according to one embodiment. During write, the ECC encoder receives, from the LLC, cache line data (operation 602) and serializes the received cache line data into a 2D array (operation 604). The size of a received data block can be the width of the cache line. The 2D array can be divided horizontally to obtain a plurality of horizontal sub-blocks. For example, each row can be a horizontal sub-block. The size of each row of data (i.e., the horizontal sub-block) can be determined based on the interface between the memory controller and the memory. In some embodiments, the width of the cache line can be 64 bytes, and the size of each horizontal sub-block can be 64 bits. The ECC encoder also receives, from the address controller, a vertical ECC enable/disable signal (operation 606). The ECC encoder determines whether the vertical ECC is enabled (operation 608). If not, the ECC encoder performs regular horizontal ECC encoding (operation 610) and sends the data along with the ECC bits to memory (operation 612).

If the vertical ECC is enabled, the ECC encoder rearranges the serialized data by vertically stacking and aligning the horizontal sub-blocks and then concatenating portions from the different horizontal sub-blocks to generate a number of vertical sub-blocks, as shown in FIG. 1A or 1B (operation 614). In other words, the ECC encoder can divide the 2D array of data vertically to form a plurality of vertical ECC sub-blocks. In the examples shown in FIGS. 1A and 1B, every eight columns of 2D array form a vertical sub-block. The ECC encoder can then perform vertical ECC encoding on the vertical sub-blocks (operation 616). In some embodiments, the vertical ECC can be a stronger ECC scheme than the horizontal ECC. For example, for each 64-bit data block, the horizontal ECC operation can compute eight parity or ECC bits, whereas the vertical ECC operation can compute 16 or even 32 ECC bits. The ECC encoder can align the vertical ECC bits to their corresponding vertical sub-blocks in a way similar to what is shown in FIG. 1A or 1B (operation 618). In the example shown in FIG. 1A or 1B, the vertical ECC bits can form two rows of data, with each row having the same size (e.g., 64 bits) as that of the horizontal sub-block. The ECC encoder can then perform the horizontal ECC operation on the horizontal sub-blocks of data and the vertical ECC bits, which are aligned with the horizontal sub-blocks of data (operation 610), and sends the data along with the ECC bits to memory (operation 612). This allows the vertical ECC bits to be protected by the horizontal ECC.

Figure 7:
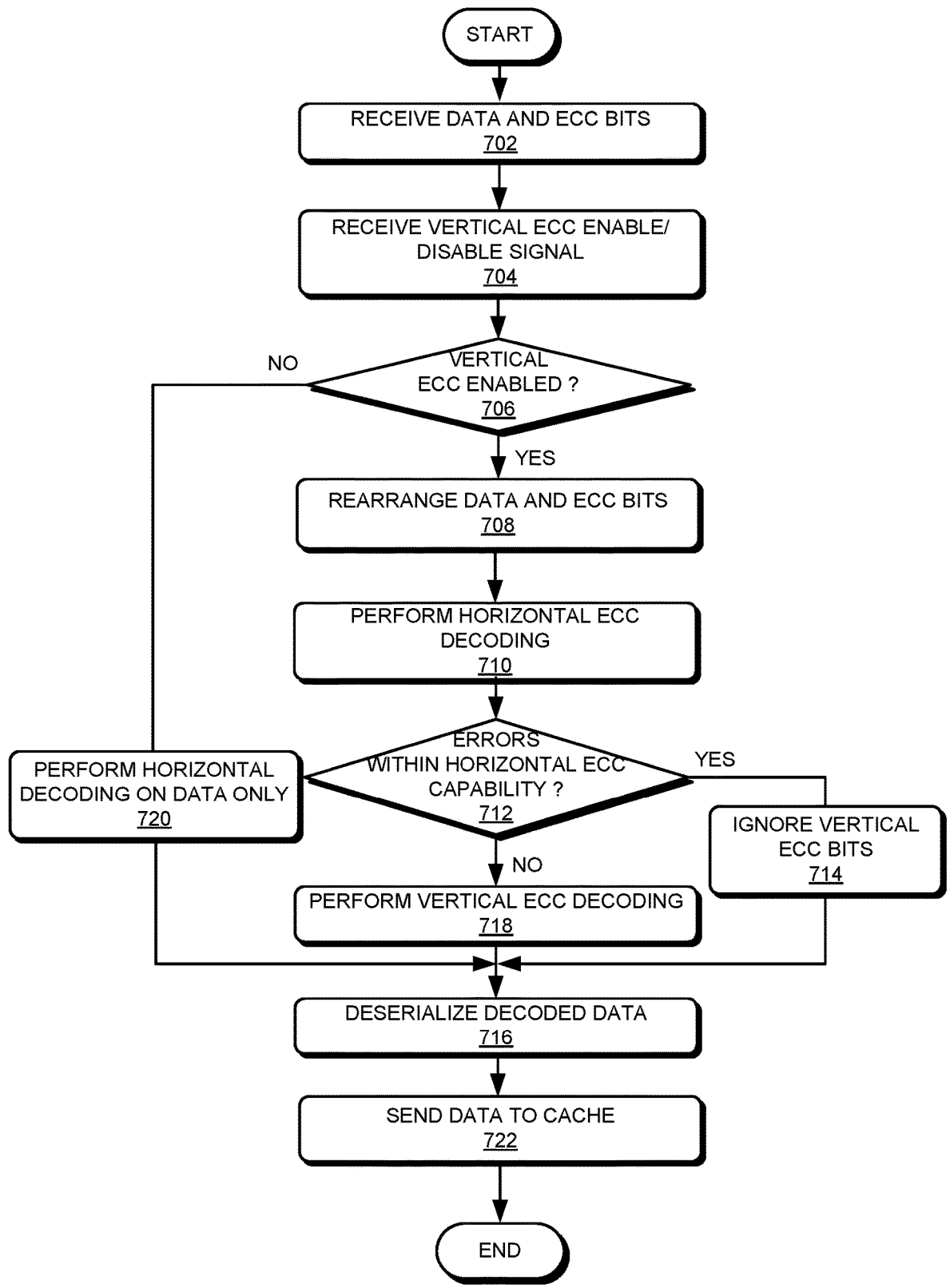
FIG. 7 presents a flowchart illustrating an exemplary read operation, according to one embodiment.

FIG. 7 presents a flowchart illustrating an exemplary read operation, according to one embodiment. During read, the ECC decoder receives, from the memory, data and ECC bits accompany the data (operation 702). The ECC decoder also receives, from the address controller, a vertical ECC enable/ disable signal (operation 704). The ECC decoder determines whether the vertical ECC is enabled (operation 706). If so, the ECC decoder can rearrange the received data and ECC bits to obtain vertical sub-blocks with the vertical ECC bits for each sub-block being aligned to the corresponding vertical sub-block (operation 708). The ECC decoder can perform regular horizontal ECC decoding on both the data and the vertical ECC bit following the data (operation 710). The ECC decoder then determines whether the number of errors in the data is within the error-correction capability of the horizontal ECC (operation 712). For example, the horizontal ECC can be able to correct single-bit errors and, subsequent to the horizontal decoding, the ECC decoder can determine whether all errors are single-bit errors. If so, the ECC decoder can ignore the vertical ECC bits (operation 714) and send the horizontally decoded data to the deserializer to re-pack the data to the cache line width (operation 716). If not, vertical ECC decoding is performed to correct any errors that are beyond the error-correction capability of the horizontal ECC (e.g., double-bit errors) (operation 718). The error-corrected data is sent to the deserializer (operation 716). If the vertical ECC is not enabled, the ECC decoder performs regular horizontal ECC decoding on the data only (operation 720) and sends the horizontally decoded data to the deserializer (operation 716). The repacked or deserialized data can then be sent to the LLC (operation 722).

Figure 8:
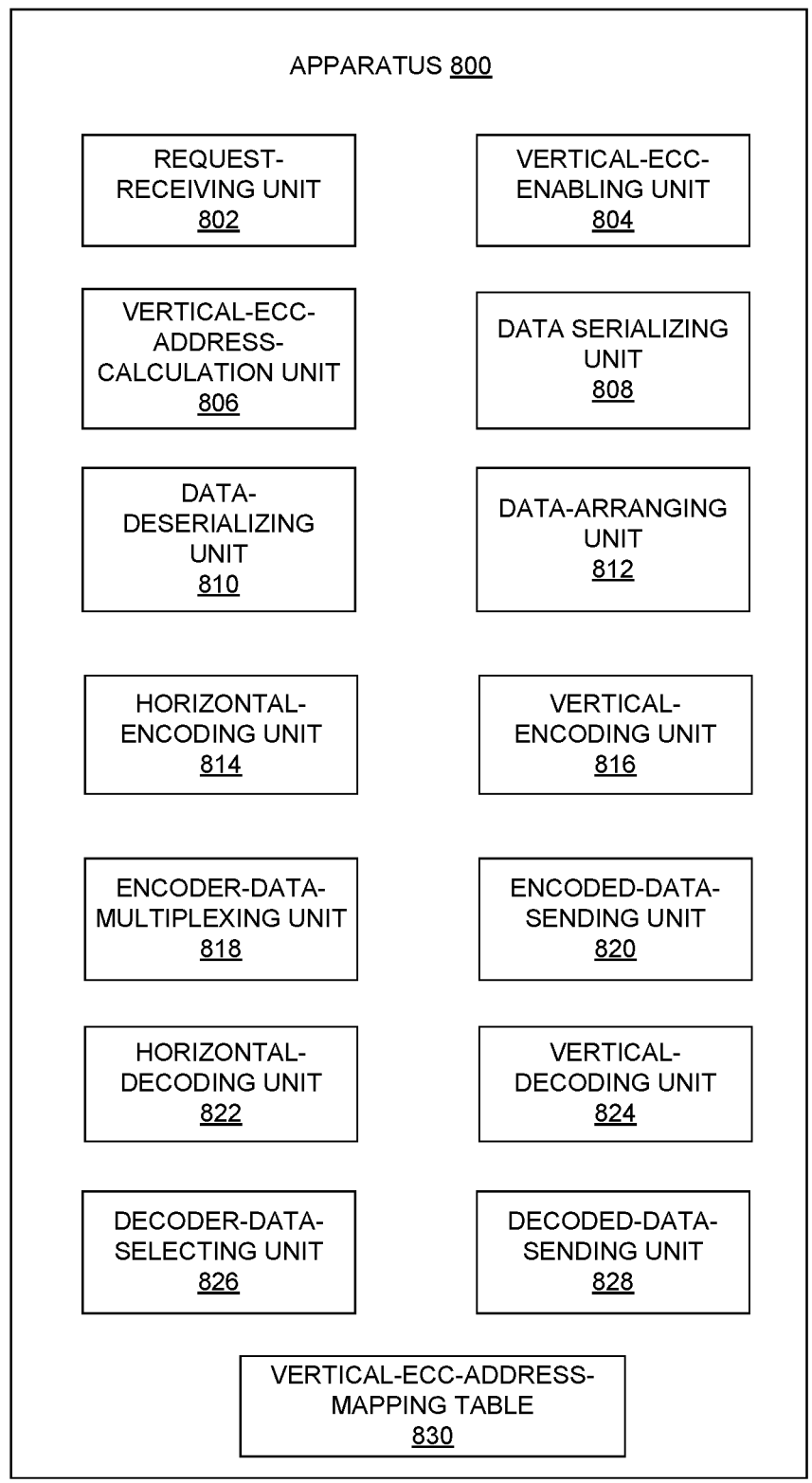
FIG. 8 illustrates an exemplary apparatus that facilitates the encoding and decoding operations for a memory device, according to one embodiment.

FIG. 8 illustrates an exemplary apparatus that facilitates the encoding and decoding operations for a memory device, according to one embodiment. Apparatus 800 can comprise a plurality of units or apparatuses which may communicate with one another via a wired, wireless, quantum light, or electrical communication channel. Apparatus 800 may be realized using one or more integrated circuits, and may include fewer or more units or apparatuses than those shown in FIG. 8. Furthermore, apparatus 800 may be integrated in a computer system, or realized as a separate device or devices capable of communicating with other computer systems and/or devices.

Apparatus 800 can include a request-receiving unit 802 for receiving, from the CPU of a host computer, a read or write request. Apparatus 800 can include a vertical-ECC-enabling unit 804 for generating enable/disable signals that can enable/disable the vertical ECC encoder and decoder, respectively. In some embodiments, vertical-ECC-enabling unit 804 generates the enable/disable signals based on the memory address included in the received read or write request. Apparatus 800 can include a vertical-ECC-address-calculation unit 806 for calculating the memory address to store the vertical ECC bits.

Apparatus 800 can include a data-serializing unit 808 for serializing data received from the cache and a data-deserializing unit 810 for deserializing decoded data before sending them to the cache. Apparatus 800 can include a data-arranging unit 812 for vertically stacking and aligning the horizontal sub-blocks and then concatenating portions from the different horizontal sub-blocks.

Apparatus 800 can include a horizontal-encoding unit 814 for encoding the horizontal sub-blocks and a vertical-encoding unit 816 for encoding, when enabled, the vertical sub-blocks. Vertical-encoding unit 816 can use a stronger ECC encoding scheme than horizontal-encoding unit 814. For example, each 64-bit horizontal sub-block can be protected using eight ECC bits, and each 64-bit vertical sub-block can be protected using 16 or even 32 ECC bits. Stronger vertical ECC can provider higher reliability but will require more memory space to store the additional ECC bits. The vertical ECC bits can also be protected by the horizontal ECC.

Apparatus 800 can include an encoder-data-multiplexing unit 818 for combining, sequentially, the horizontal sub-blocks with vertical ECC bits. Apparatus 800 can include an encoded-data-sending unit 820 for sending the encoded data to the memory.

Apparatus 800 can include a horizontal-decoding unit 822 for decoding the horizontal sub-blocks and a vertical-decoding unit 824 for decoding, when enabled, the vertical sub-blocks. When the error-correction capability provided by horizontal-decoding unit 822 is sufficient in correcting all soft errors in the data, vertical-decoding unit 824 can be skipped. Apparatus 800 can include a decoder-data-selecting unit 826 for selecting output from horizontal-decoding unit 822 or vertical-decoding unit 824 to send to data-deserializing unit 810. Apparatus 800 can include a decoded-data-sending unit 828 for sending the decoded and deserialized data to the cache.

In addition, apparatus 800 can include a vertical-ECC-address-mapping table 830 that include entries indicating memory regions protected by the vertical ECC. Entries in ECC-address-mapping table 830 can also be used to calculate the vertical ECC address.

Figure 9:
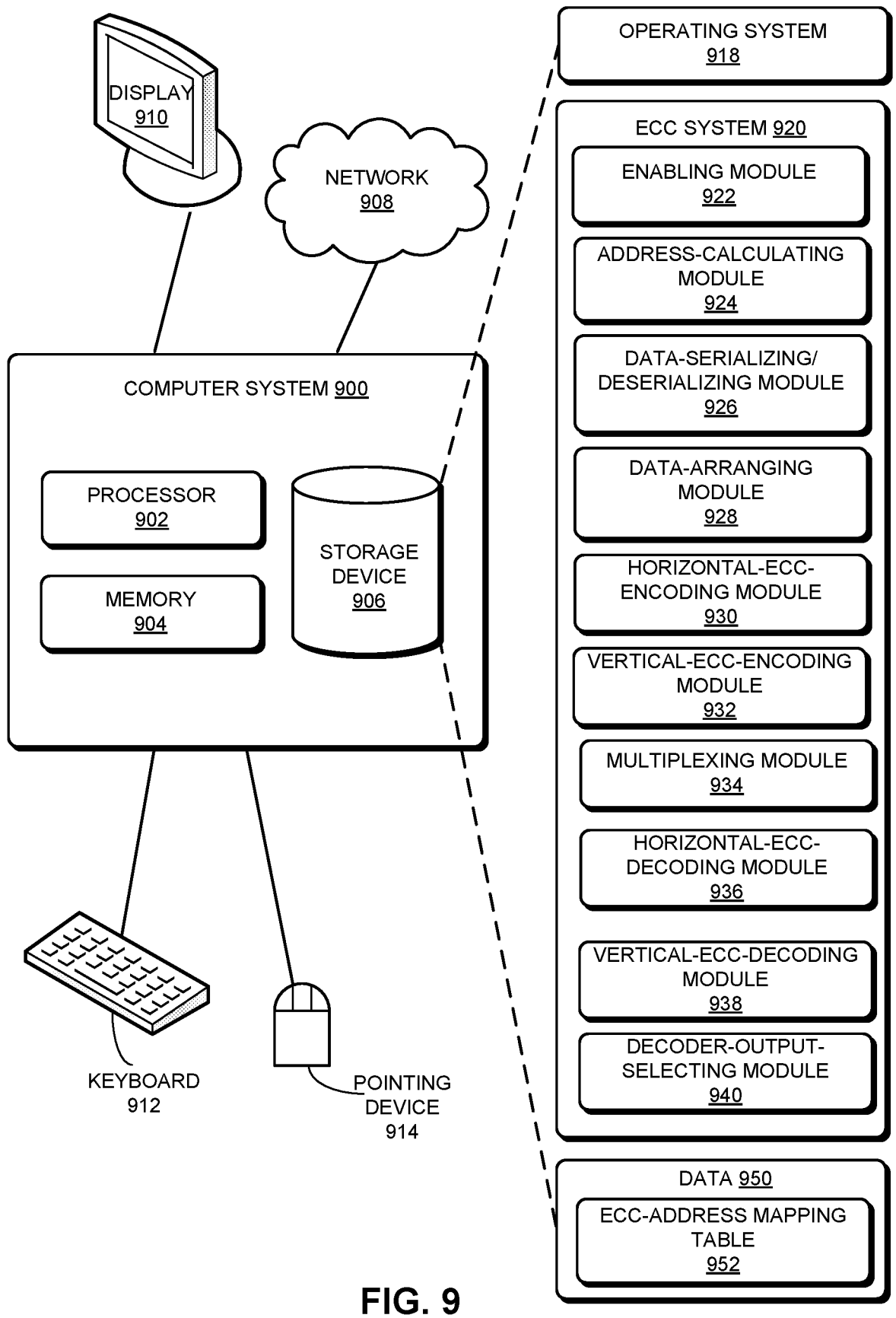
FIG. 9 illustrates an exemplary computer system that facilitates memory-mapped 2D ECC, according to one embodiment.

FIG. 9 illustrates an exemplary computer system that facilitates memory-mapped 2D ECC, according to one embodiment. Computer system 900 includes a processor 902, a memory 904, and a storage device 906. Computer system 900 can be coupled to a display device 910, a keyboard 912, and a pointing device 914, and can also be coupled via one or more network interfaces to network 908. Storage device 906 can store an operating system 918, an ECC system 920, and data 950.

ECC system 920 can include instructions, which when executed by computer system 900 can cause computer system 900 to perform methods and/or processes described in this disclosure. ECC system 920 can include instructions for enabling/disabling vertical ECC (enabling module 922), instructions for calculating the vertical ECC address (address-calculating module 924), instructions for serializing/deserializing data (data-serializing/deserializing module 926), instructions for arranging data into vertical sub-blocks (data-arranging module 928), instructions for performing horizontal ECC encoding (horizontal-ECC-encoding module 930), instructions for performing vertical ECC encoding (vertical-ECC-encoding module 932), instructions for combining horizontal sub-blocks with vertical ECC bits (multiplexing module 934), instructions for performing horizontal ECC decoding (horizontal-ECC-decoding module 936), instructions for performing vertical ECC decoding (vertical-ECC-decoding module 938), and instructions for selecting decoder output to be sent to the cache (decoder-output-selecting module 940). Data 950 can include an ECC-address mapping table 952.

In general, the system provides an efficient and dynamic error-protection mechanism by implementing memory-mapped 2D ECC. Compared to traditional memory-mapped ECC that can only map ECC bits in cache to memory, the disclosed embodiments can improve memory reliability by directly mapping vertical memory ECC bits to a programmable memory region. Similarly, compared to the existing hardware-based 2D ECC only applicable to cache, the disclosed embodiments can be applied in memory and allows the operating system on the host CPU to control the mapping of ECC to a given range of the memory. Consequently, the operating system can take proactive actions such as disabling and mapping out a problematic memory node or migrating the applications to a different memory node. Moreover, by allowing the operating system to determine which memory regions to provide extra protection, the disclosed embodiments can provide much fine-grained tradeoff between the memory capacity and the error-correction capability. Unlike a full-memory mirroring scheme that costs 50% of the memory capacity for error correction even when there are only few soft errors, an exemplary embodiment can provide 16-bit error correction for 64-byte data blocks in the memory regions at a cost of less than 20% of the memory capacity. It can provide a much more graceful degraded execution when a particular memory node becomes soft-error prone by gradually increasing memory regions in need of extra protection.

In the examples shown in FIGS. 1A and 1B, the cache line width is 64-bytes. In practice, the ECC system can work with any cache line width, such as 32-bytes or 128-bytes. In addition, in the various examples, the horizontal ECC uses eight parity bits to protect 64 bits of data, and the vertical ECC uses 16 parity bits to protect 64 bits of data. In practice, different ECC implementations can be used, as long as the vertical ECC can provide a stronger protection than the horizontal ECC. For example, it is also possible for the vertical ECC to use 32 parity bits to protect the 64 bits of data. Another variation in the implementation can include the formation of the horizontal and vertical sub-blocks. In the examples shown in FIGS. 1A and 1B, the horizontal and vertical sub-blocks have the same size. In practice, they can have different sizes. For example, a horizontal sub-block can be 64-bits in size, whereas a vertical sub-block can be 128-bits in size. Moreover, the ways to group data into horizontal and vertical sub-blocks are not limited by the examples shown in FIGS. 1A and 1B.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A method for providing error-correction protection associated with a storage device, the method comprising:
   in response to a write request, organizing a block of data to be written to the storage device in a two-dimensional (2D) array;
   forming a plurality of first-dimension sub-blocks by dividing the 2D array along a first dimension;
   forming a plurality of second-dimension sub-blocks by dividing the 2D array along a second dimension;
   in response to determining that second-dimension error correction code (ECC) encoding is enabled, performing the second-dimension ECC encoding on the second-dimension sub-blocks to generate a set of second-dimension ECC bits; and performing first-dimension ECC encoding on both the first-dimension sub-blocks and the generated set of second-dimension ECC bits to generate a first set of first-dimension ECC bits to protect the first-dimension sub-blocks and a second set of first-dimension ECC bits to protect the generated set of second-dimension ECC bits; and writing the data block along with the second-dimension ECC bits and the first-dimension ECC bits to the storage device via a memory interface, wherein a data width of the memory interface equals to a length of a respective first-dimension sub-block plus a length of corresponding first-dimension ECC bits for the first-dimension sub-block, wherein the second-dimension ECC bits are treated as additional first-dimension sub-blocks to the data block and are similarly mapped to physical addresses in the storage device.

2. The method of claim 1, wherein forming a respective second-dimension sub-block comprises concatenating a portion of data from a first first-dimension sub-block with a corresponding portion of data from an adjacent first-dimension sub-block.

3. The method of claim 1, wherein the second-dimension ECC encoding is configured to provide a stronger error-correction protection than the first-dimension ECC encoding.

4. The method of claim 3, wherein the block of data is 64-bytes long, wherein a respective first-dimension sub-block and a respective second-dimension sub-block are each 64-bits long, wherein performing the first-dimension ECC encoding comprises computing eight ECC bits for each first-dimension sub-block, and wherein performing the second-dimension ECC encoding comprises computing 16 ECC bits for each second-dimension sub-block.

5. The method of claim 3, wherein the first-dimension ECC encoding is configured to provide single-bit error correction and double-bit error detection (SECDED), and wherein the second-dimension ECC encoding is configured to provide double-bit error correction and triple-bit error detection (DECTED).

6. The method of claim 1, further comprising:
determining a physical address included in the write request;
determining whether the physical address is within a region of the storage device configured to be protected by the second-dimension ECC encoding by looking up an address-mapping table; and
in response to determining that the physical address is within a region of the storage device configured to be protected by the second-dimension ECC encoding, setting a second-dimension ECC encoding enable bit and calculating a second-dimension ECC address to which the second-dimension ECC bits are mapped.

7. The method of claim 6, further comprising:
in response to determining that the physical address is not within a region of the storage device configured to be protected by the second-dimension ECC encoding, clearing the second-dimension ECC encoding enable bit.

8. The method of claim 1, further comprising:
in response to a read request and determining that second-dimension ECC decoding is enabled, reading the data block along with the second-dimension ECC bits and the first-dimension ECC bits from the storage device; and
performing first-dimension ECC decoding for the data block and the second-dimension ECC bits based on the first-dimension ECC bits.

9. The method of claim 8, further comprising:
in response to a read request and determining that the second-dimension ECC decoding is disabled, reading the data block along with the second-dimension ECC bits and the first-dimension ECC bits from the storage device;
performing first-dimension ECC decoding for the data block only based on corresponding ECC bits included in the first-dimension ECC bits; and
outputting the data block decoded using the first-dimension ECC decoding.

10. The method of claim 8, further comprising:
in response to determining that the first-dimension ECC decoding corrects all errors in the data block, outputting the data block decoded using the first-dimension ECC decoding;
in response to determining that the first-dimension ECC decoding fails to correct all errors in the data block, performing second-dimension decoding for the data block based on the second-dimension ECC bits and outputting the data block decoded using the second-dimension ECC decoding.

11. A controller for facilitating error-correction protection associated with a storage device, further comprising:
a data serializer configured to serialize a block of cache line data to a two-dimensional (2D) array, wherein each row in the 2D array along a first dimension forms a first-dimension sub-block;
a data-arranging unit configured to form a plurality of second-dimension sub-blocks by dividing the 2D array along a second dimension;
a second-dimension error correction code (ECC) encoder configured to, in response to being enabled, perform second-dimension ECC encoding on the second-dimension sub-blocks to generate a set of second-dimension ECC bits;
a first-dimension ECC encoder configured to perform first-dimension ECC encoding on both first-dimension sub-blocks of the cache line data block and the generated set of second-dimension ECC bits to generate a first set of first-dimension ECC bits to protect the first-dimension sub-blocks and a second set of first-dimension ECC bits to protect the generated set of second-dimension ECC bits; and
a data-sending unit configured to send the data block along with the second-dimension ECC bits and the first-dimension ECC bits to the storage device via a memory interface, wherein a data width of the memory interface equals to a length of the first-dimension sub-block plus a length of corresponding first-dimension ECC bits for the first-dimension sub-block, wherein the second-dimension ECC bits are treated as additional first-dimension sub-blocks to the data block and are similarly mapped to physical addresses in the storage device.

12. The controller of claim 11, wherein, while forming a respective second-dimension sub-block, the data-arranging unit is configured to concatenate a portion of data from a first first-dimension sub-block with a corresponding portion of data from an adjacent first-dimension sub-block.

13. The controller of claim 11, wherein the second-dimension ECC encoder is configured to provide a stronger error-correction protection than the first-dimension ECC encoder.

14. The controller of claim 13, wherein the block of cache line data is 64-bytes long, wherein a respective first-dimension sub-block and a respective second-dimension sub-block are each 64-bits long, wherein the first-dimension ECC encoder is configured to compute eight ECC bits for each first-dimension sub-block, and wherein the second-dimension ECC encoder is configured to compute 16 ECC bits for each second-dimension sub-block.

15. The controller of claim 13, wherein the first-dimension ECC encoder is configured to provide single-bit error correction and double-bit error detection (SECDED), and wherein the second-dimension ECC encoder is configured to provide double-bit error correction and triple-bit error detection (DECTED).

16. The controller of claim 11, further comprising an address controller configured to:
   determine a physical address included in a write request associated with the cache line data block;
   determine whether the physical address is within a region of the storage device configured to be protected by the second-dimension ECC encoding by looking up an address-mapping table; and
   in response to determining that the physical address is within a region of the storage device configured to be protected by the second-dimension ECC encoding, set a second-dimension ECC encoding enable bit and calculate a second-dimension ECC address to which the second-dimension ECC bits are mapped.

17. The controller of claim 16, wherein the address controller is further configured to:
   in response to determining that the physical address is not within a region of the storage device configured to be protected by the second-dimension ECC encoding, clear the second-dimension ECC encoding enable bit.

18. The controller of claim 11, further comprising a data-read module configured to read the data block along with the second-dimension ECC bits and the first-dimension ECC bits from the storage device in response to a read request and determining that second-dimension ECC decoding is enabled; and
   a first-dimension ECC decoder configured to perform first-dimension ECC decoding for the data block and the second-dimension ECC bits based on the first-dimension ECC bits.

19. The controller of claim 18, wherein the first-dimension ECC decoder is configured to:
   in response to determining that the second-dimension ECC decoding is disabled, perform first-dimension ECC decoding for the data block only based on corresponding ECC bits included in the first-dimension ECC bits; and
   send the data block decoded using the first-dimension ECC decoding to a cache coupled to the controller.

20. The controller of claim 18, further comprising a second-dimension ECC decoder;
   wherein the first-dimension ECC decoder is configured to output the data block decoded using the first-dimension ECC decoding to a cache coupled to the controller, in response to determining that the first-dimension ECC decoding corrects all errors in the data block;
   wherein the first-dimension ECC decoder is configured to send the second-dimension ECC bits decoded using the first-dimension ECC decoding to the second-dimension ECC decoder to facilitate the second-dimension ECC decoder to perform second-dimension decoding for the data block, in response to determining that the first-dimension ECC decoding fails to correct all errors in the data block; and
   wherein the second-dimension ECC decoder is configured to output the data block decoded using the second-dimension ECC decoding to the cache coupled to the controller.

* * * * *